(12) United States Patent
Fukuda

(10) Patent No.: US 6,518,180 B1
(45) Date of Patent: Feb. 11, 2003

(54) METHOD FOR FABRICATING SEMICONDUCTOR DEVICE AND METHOD FOR FORMING MASK SUITABLE THEREFOR

(75) Inventor: Hiroshi Fukuda, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/830,079

(22) PCT Filed: Oct. 23, 1998

(86) PCT No.: PCT/JP98/04810

§ 371 (c)(1),
(2), (4) Date: Apr. 23, 2001

(87) PCT Pub. No.: WO00/25181

PCT Pub. Date: May 4, 2000

(51) Int. Cl.$^7$ .................................................. H01L 21/44
(52) U.S. Cl. ........................................ 438/671; 438/551
(58) Field of Search .................. 438/524, 525, 438/551, 637, 706, 708, 709, 671, 717, 778

(56) References Cited

U.S. PATENT DOCUMENTS 5,885,735 A * 3/1999 Imai et al. ...................... 430/5
6,008,914 A * 12/1999 Sasagawa et al. ............. 359/15

FOREIGN PATENT DOCUMENTS

| JP | 1283925 | 11/1989 |
| JP | 5-197126 | 8/1993 |
| JP | 5-204131 | 8/1993 |
| JP | 7-226362 | 8/1995 |
| JP | 8-51068 | 2/1996 |
| JP | 8-227140 | 9/1996 |
| JP | 8-236428 | 9/1996 |
| JP | 10-092714 | 4/1998 |

OTHER PUBLICATIONS

Handbook of Microlithography, Micromachining and Microfabrication, vol. 1: Microlithography (SPIE Press, 1997, Bellingham, pp. 71–82.
Y.C. Pati, SPIE: Optical/Laser Microlithography VII, SPIE, vol. 2197, 1994, pp. 314–327.
Ooi et al, Japanese Journal of Applied Physics, vol. 33, 1994, pp. 6774–6778.

* cited by examiner

*Primary Examiner*—David Nelms
*Assistant Examiner*—David Nhu
(74) *Attorney, Agent, or Firm*—Mattingly, Stanger & Malur, P.C.

(57) ABSTRACT

A phase-shifting mask extracted an end, corner, intersection or the like of a random interconnect pattern, and a phase-shifting mask for exposing the other region are multiple-exposed on an identical resist film via a projection optical system. Alternatively, an arbitrary pattern is quantized into two or four phase-shifting masks to perform the multiple exposure similarly.

Thereby, the interconnect pitch of a logic LSI can be reduced by optical lithography, and thus there can be manufactured a high-performance LSI with its low cost and high throughput while suppressing an interconnect delay.

8 Claims, 21 Drawing Sheets

▨ WIRING LAYER 1
☐ WIRING LAYER 2
⊗ VIA HOLE

LIGHT INTENSITY DISTRIBUTION OBTAINED BY MULTIPLE EXPOSURE

P1
DESIGNED PATTERN LAYONT

LATTICE PATTERNS FOR PHASE ASSIGUMENT

GENERATED MASK PATTERN

DESIGNED PATTERN LAYONT

DESIGNED PATTERN LAYOUT

MASK PATTERN

DESIGNED PATTERN LAYOUT

MAGNIFIED VIEW OF STANDARD
CELL LOGIC BLOCK

METHOD FOR FABRICATING SEMICONDUCTOR DEVICE AND METHOD FOR FORMING MASK SUITABLE THEREFOR

TECHNICAL FIELD

The present invention relates to a method for manufacturing a semiconductor device, and more particularly, to a method for forming a pattern for use in steps of manufacturing a semiconductor device including a logic integrated circuit (IC) and also to a method for forming a mask.

BACKGROUND ART

Higher performance and integration of a semiconductor integrated circuit (LSI) has been achieved by making a circuit pattern finer. In particular, with respect to a logic LSI, its operation speed (operation frequency) has been improved by reducing a transistor gate length (Lg). With an enlarged chip scale and complicated system, however, a total wiring length within a chip has been abruptly increased, thus resulting in that a speed reduction (interconnect delay) caused by a wiring resistance and capacity governs the entire circuit performance. For the purpose of solving this problem, it becomes important to reduce a chip scale and to suppress the total wiring length by making smaller an interconnect pitch (wiring pitch) (a minimum spacing between centers of adjacent wiring lines or wiring period).

In the circuit formation, optical lithography (reduction projection exposure) is currently used, and its resolution is improved by reducing the wavelength of exposure light and increasing a numerical aperture (NA) of a projection lens. With respect to the above wiring pitch, 0.8–0.5 μm is currently attained with use of a KrF excimer laser exposure apparatus (having a wavelength of 248 nm), and it is considered to be able to attain about 0.4–0.35 μm with use of an ArF excimer laser exposure apparatus (having a wavelength of 193 nm). However, it is expected difficult to realize a smaller wiring pitch than the above level with use of the conventional reduction projection exposure method using far-infrared ray. As a method for realizing a finer pattern, there has been studied an electron beam direct writing (EBDW) method or an X-ray proximity exposure method. In the electron beam direct writing method, however, an enormous amount of time is generally required because individual patterns are sequentially written. In order to solve this problem, there is studied a cell projection method which can collectively transfer certain scales of patterns (e.g., having an about 5 μm square). In this method, however, since the types of settable patterns are restricted, this method is not necessarily effective for a random interconnect pattern of a logic LSI or the like which requires a very large number of types of patterns. (In this connection, it is assumed in this specification that the word "random" is used to mean not iterative or cyclical.) Also there is studied a SCALPEL (SCattering with Angular Limitation Projection Electron-Beam Lithography) method which can scanningly expose a large-area mask. However, its attainable throughput is considered to be about 10 sheets of 8-inch wafers at the most, which corresponds to about ¹⁄₁₀ of the throughput by the current optical lithography. The X-ray proximity exposure method, on the other hand, has a problem that it is difficult to realize a mask having a sufficient accuracy.

Meanwhile, as a method for improving a resolution performance without changing an optical system in the optical lithography, a phase-shifting mask method is known. In this method, the resolution of the optical system is remarkably improved over the resolution when a conventional mask is used, by controlling (usually, inverting) the phase of light passed through a specific opening on a mask. There are various types of phase-shifting mask methods, among which an alternating phase-shifting mask method can provide the greatest resolution improving effect. The phase-shifting mask method is discussed, for example, in Handbook of Microlithography, Miromachining, and Microfabrication, Vol.1: Microlithography (SPIE Press, 1997, Bellingham, pp.71–82. The alternating phase-shifting mask method can be easily applied to an alternating pattern as its name implies, but it cannot be necessarily applied to a general pattern of any shape. For example, for Japanese-Character " ⊃ "-shaped pattern or a pattern having three opening patterns are arranged as mutually spaced by a shortest distance, it becomes difficult to obtain phase assignment. An example of a pattern having a difficult phase assignment is shown in FIG. 1.

A method for performing multiple exposure over an identical resist film with use of a plurality of masks including a phase-shifting mask in order to enable transfer of a pattern having an arbitrary shape is filed by the inventors of the present application as Japanese Patent Nos. 2650962 and 2638561. This method is applied, in particular, to processing or the like of a logic LSI gate which requires formation of a highly-thin-line pattern by controlling its line width with a high accuracy. That is, a phase shifter (a region to be inverted in phase on a mask) is arranged so that the phases of openings on both sides of a gate are inverted, whereby a gate pattern can be remarkably improved in its resolution, line width accuracy, depth of focus, etc. However, an edge part of the shifter is transferred as an unnecessary pattern. In order to avoid it, the original design pattern is divided into two mask patterns for multiple exposure. Patterns on each of the above two masks can be automatically generated from the original design pattern through geometrical operations.

A method for generating two phase-shifting masks which can form any pattern based on multiple exposure using a phase retrieval method is suggested by Y. C. Pati, et al (in SPIE: Optical/Laser Microlithography VII, SPIE Vol. 2197 (1994), pp.314–327). This, in principle, proves that any pattern can be realized by the multiple exposure of the two phase-shifting masks.

Also suggested by B. J. Lin (in Japanese Patent Laid-Open Publication: JP-A-8-227140) is a method for dividing any pattern into horizontal and vertical patterns, using the both patterns respectively as a one-dimensional alternating phase-shifting mask, and performing multiple exposure over the both.

Also suggested by Ooi, et al (in Japanese Journal of Applied Physics, Vol. 33 (1994), pp.6774–6778) is a method, for the purpose of applying a phase mask method to a random pattern, for performing phase assignment over a figure at symbolic level and thereafter for performing compaction according to a phase relation between figures to thereby avoid phase conflicts. This method is intended to solve the phase conflicts by relaxing pattern dimensions for the phase conflict parts, which involves change of the design mask pattern itself. In addition, the method is not used to perform multiple exposure over two masks.

As mentioned above, however, we can say that, in the electron beam direct writing method, it is highly difficult to form such a random pattern as a wiring layer or active layer of a logic LSI with a practical throughput.

Meanwhile, it is difficult to apply the alternating phase-shifting mask method to a random pattern. In particular, the scale of a recent logic LSI exceeds such a level as manually designable, and thus the LSI is designed using an automatic place and route method. Accordingly, even formation of the phase-shifting mask phase-shifting mask is required to be carried out for a massive amount of pattern data generated automatically, which cannot be manually done by trial and error impractically. However, since the phase assignment method using the aforementioned phase retrieval method requires a very large amount of computation, it is practically difficult to process the massive amount of data in a practical time, and further a generated mask pattern becomes complex. Thus this method has a problem that the method necessarily pays no consideration to its actual mask manufacturing limit, etc.

The method for performing compaction after phase arrangement at symbolic level goes against the circuit miniaturization because the method relaxes the dimensions of the phase conflict parts.

In the method for dividing a pattern into vertical and horizontal patterns, it is difficult to cope with a general pattern in the random wiring of a logic LSI. For example, when a pattern of FIG. 1 is divided vertically and horizontally, two masks V and H as shown in FIG. 2 are generated. In this case, however, phase conflict between two openings X1 and X2 in the mask H cannot be solved. The known example teaches an idea that, in a similar case, the opening patterns X1 and X2 on the mask are further divided two masks. In this case, however, it is difficult to clearly divide the opening patterns X1 and X2 because the X1 and X2 become an incoherent summation. Further, since a general guideline is not given for it, it becomes difficult to apply this method to a large scale LSI pattern including such a large number of random patterns substantially impossible to be manually processed as mentioned above.

There has not exited so far a general and practical method of applying the alternating phase-shifting mask method to a random interconnect pattern. For this reason, there exist problems that (1) miniaturization of a circuit pattern of a logic LSI as well as reduction of a chip area are undesirably governed by the limits of the wiring pitch in the optical lithography using a conventional mask, and (2) when it is desired to attain a wiring pitch reduction exceeding the limit of the optical lithography using the conventional mask, use of the electron beam direct writing method having a very low throughput is inevitably required.

It is a first object of the present-invention to provide a pattern formation method which can attain a fine alternating wiring pattern exceeding the limit of the prior art method with use of an optical lithography by applying an alternating phase-shifting mask method to a random pattern such as an active layer or wiring layer in a logic LSI.

A second object of the present invention is to provide a general method for generating a mask necessary when an alternating phase-shifting mask method can be applied to the random pattern while eliminating the need for changing a designed pattern itself, and also to provide a computation method for automatically forming a pattern for the mask for a large-scale LSI pattern in a practical time.

A third object of the present invention is to provide a method for manufacturing a semiconductor device (in particular, a logic LSI having a random wiring pattern) having a fine wiring pattern so far considered practically difficult to obtain by a conventional optical lithography, with low cost and high throughput, by using the above pattern formation method and mask. It is also an object to provide a method for manufacturing a high-performance LSI with a reduced chip area and a suppressed interconnect delay, by reducing a wiring pitch of the logic LSI.

DISCLOSURE OF INVENTION (Solving Means)

The above first object is attained, when it is desired to form a desired pattern including broken-line-like figures having a plurality of linear, broken-line-like or branch lines by projecting light passed through a mask onto a resist film formed on a substrate via an optical system to expose the film, by multiple-exposing the resist film with first and second masks including an opening having a grid point corresponding to an end, angular or intersection part of the pattern located substantially in its center. The desired pattern including the broken-line-line figures having linear, broken-line-like or branch lines is preferably a pattern wherein grid points on a predetermined grid are arranged to be connected along the grid. Further, the first and second masks are preferably phase shifter masks.

The first mask is considered to be a phase-shifting mask which has openings with each grid point position of the grid included in the designed pattern located substantially nearly in their centers and wherein the phases of light passed through the adjacent openings spaced by a constant distance are inverted mutually; whereas, the second mask is considered to be a phase-shifting mask which has openings with midpoints between adjacent grid points on a grid in one direction located substantially in their center and wherein the phases of light passed through the adjacent openings spaced by a constant distance are mutually inverted. Further, such a third phase-shifting mask that has openings with midpoints between adjacent grid points of the grid included in the pattern in one direction and a vertical direction located substantially in their center may be multiple-exposed.

Further, the first mask may be a phase-shifting mask which has openings with grid points or nearest neighboring grid points corresponding to ends, corners or intersections of the linear pattern located substantially in their center and wherein the phases of light passed through adjacent openings spaced by a constant distance are mutually inverted; while, the second mask may be a phase-shifting mask which has openings in the form of such linear patterns between the grid points as connected in either one direction of horizontal and vertical directions and wherein the phases of light passed through the openings located within a constant distance in the one direction and in the vertical direction are mutually inverted. When the original pattern includes patterns in both vertical and horizontal directions, such a third phase-shifting mask that has openings in the form of linear patterns as connected between the grid points in a direction vertical to the linear pattern of the second mask and that the phases of light passed through the openings within a constant distance in that direction and in the vertical direction are mutually inverted may be further multiple-exposed.

May be used as the first mask a phase-shifting mask which has openings with grid points corresponding to ends, corners or intersections of the linear pattern or nearest neighboring grid points thereof located substantially in their center and wherein the phases of light passed through the adjacent openings spaced by a constant distance are mutually inverted. May be used as the second mask a phase-shifting mask of a half-tone type which has openings in a region other than the linear pattern or ends of the linear pattern and has a partial transmission region other than the openings through which exposure light is passed as attenuated, and wherein the phase of light passed through the partial transmission region is inverted substantially to the phase of light passed through the openings. Further usable as the first mask is a phase-shifting mask of a half-tone type wherein the above openings are used as they are and the light shielding part is replaced by the partial transmission region similarly to the above second mask. It is preferable that these phase-shifting masks of the half-tone type be exposed by modified illumination.

The above first object is attained, when light passed through a mask is project-exposed onto a resist film formed on a substrate via an optical system to thereby form an arbitrary geometrical pattern on the substrate, by decomposing an existence region of the geometrical pattern with use of a predetermined grid, extracting minimum elements of the grid at intervals of one minimum element in vertical and horizontal directions to divide the entire region decomposed with the grid into four partial regions A, B, C and D, generating opening patterns of dimensions corresponding to a ratio of a common region of the geometrical pattern and each of the minimum elements belonging to the partial regions A, B, C and D occupied within the element in the vicinity of a center of the element, and multiple-exposing at least any two or more of a first phase-shifting mask which has openings generated from said minimum elements belonging to the partial region A, phases of light passed through adjacent ones of said openings within a constant distance being mutually inverted, a second phase-shifting mask which has openings generated from said minimum elements belonging to the partial region B, phases of light passed through adjacent ones of said openings within a constant distance being mutually inverted, a third phase-shifting mask which has openings generated from said minimum elements belonging to the partial region C, phases of light passed through adjacent ones of said openings within a constant distance being mutually inverted, and a fourth phase-shifting mask which has openings generated from said minimum elements belonging to the partial region D, phases of light passed through adjacent ones of said openings in a constant distance being mutually inverted. It is preferable that the arbitrary geometrical pattern be made up of a combination of some of the minimum elements on the grid.

The second object is attained, when a phase-shifting mask pattern is generated by multiple-exposing on a substrate a desired pattern including a designed pattern of grid points on a predetermined grid arranged to connect the grid points along the grid with use of a plurality of phase-shifting masks via an optical system, by generating a first mask pattern including openings corresponding nearly in their centers to positions of the grid points included in the designed pattern and a phase shifter for mutually inverting phases of light passed through adjacent ones of the openings within a constant distance in vertical and horizontal directions, generating a second mask pattern including openings corresponding nearly in their centers to intermediate points between adjacent ones of the grid points included in the designed pattern in the horizontal direction and a phase shifter for mutually inverting phases of light passed through adjacent ones of the openings in vertical and horizontal directions, and generating a third mask pattern including openings corresponding nearly in their centers to intermediate points between adjacent ones of the grid points included in the designed pattern in the vertical direction and a phase shifter for mutually inverting phases of light passed through adjacent ones of the openings within a constant distance in the vertical and horizontal directions.

Alternately the second object is attained by generating a first mask pattern including openings corresponding nearly in their centers to the grid points (which will be generally called the connection nodes) corresponding to ends, corners or intersections in the designed pattern and corresponding to the grid points (which will be called the peripheral nodes) in the vicinity thereof and also including a phase shifter for mutually inverting phases of light passed through adjacent ones of the openings within a constant distance in vertical and horizontal directions, by generating a second mask pattern including such openings as to bury between the connection nodes in the designed pattern in the horizontal direction and including a phase shifter for mutually inverting phases of light passed through adjacent ones of the openings within a constant distance in the vertical direction and by generating a third mask pattern including such openings as to bury between the connection nodes in the designed pattern in the vertical direction and including a phase shifter for mutually inverting phases of light passed through adjacent ones of the openings within a constant distance in the horizontal direction.

Or the second object is attained by generating a first mask pattern which has openings with the connection nodes or peripheral nodes located substantially in their centers and which includes a phase shifter for mutually inverting the phases of light passed through adjacent one of the openings within a constant distance in vertical and horizontal directions, and generating a second mask pattern which has such openings as to bury between the connection nodes respectively in the vertical and horizontal directions in the designed pattern and which includes a half-tone type transmission region for passed as attenuated exposure light through a zone other than the openings and for substantially inverting the phase of the transmitted light to the phase of light passed through the openings.

The third object is attained, when a semiconductor integrated circuit including a wiring pattern having a non-iterative arrangement is manufactured, by generating a plurality of phase-shifting masks for the wiring pattern and by multiple-exposing the phase-shifting masks on an identical resist layer to form the wiring pattern.

(Effects)

In accordance with the present invention, a phase-shifting mask having extracted connection nodes corresponding to ends, corners or intersections of a random interconnect pattern as well as a phase-shifting mask for exposure of the other region are multiple-exposed on an identical resist film via a projection optical system. As a result, since the resolution of an alternating phase-shifting mask method can be realized even for a random pattern such as wiring of a logic LSI or the like, the interconnect pitch of a logic LSI can be reduced by optical lithography, and thus a high-performance LSI having a suppressed interconnect delay (RC delay) can be manufactured with a low cost and a high throughput.

BEST MODE FOR CARRYING OUT THE INVENTION

Figure 1:
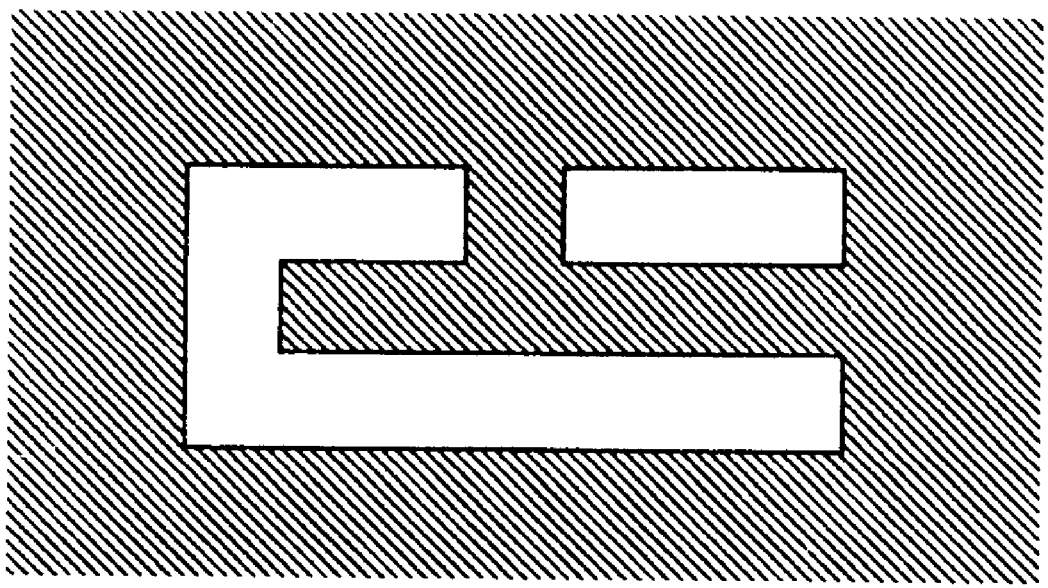
FIG. 1 diagrammatically shows an example of a pattern to which it is difficult to apply a phase-shifting mask technology.
Figure 2:
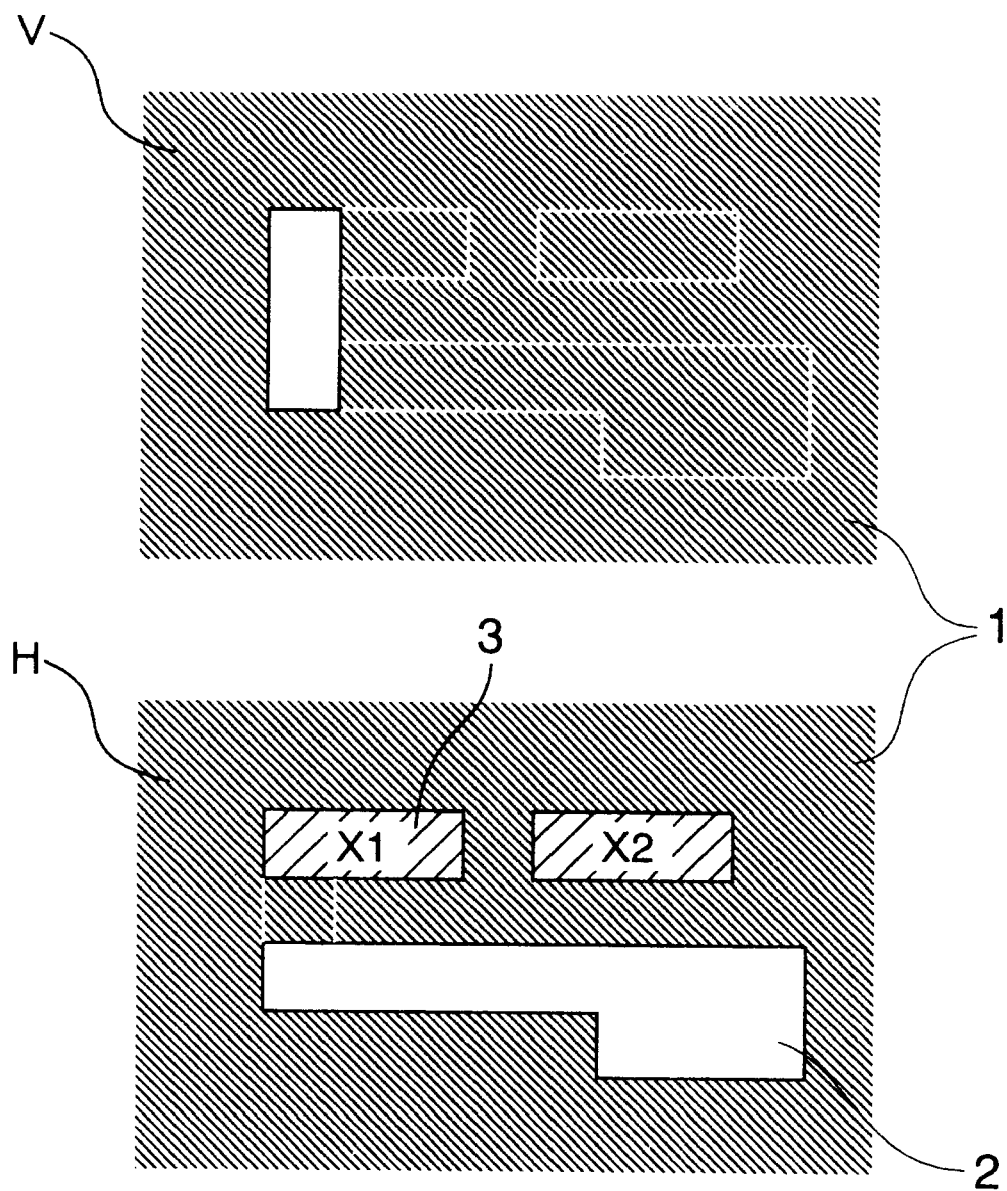
FIG. 2 diagrammatically shows mask patterns based on a conventional method.
Figure 3:
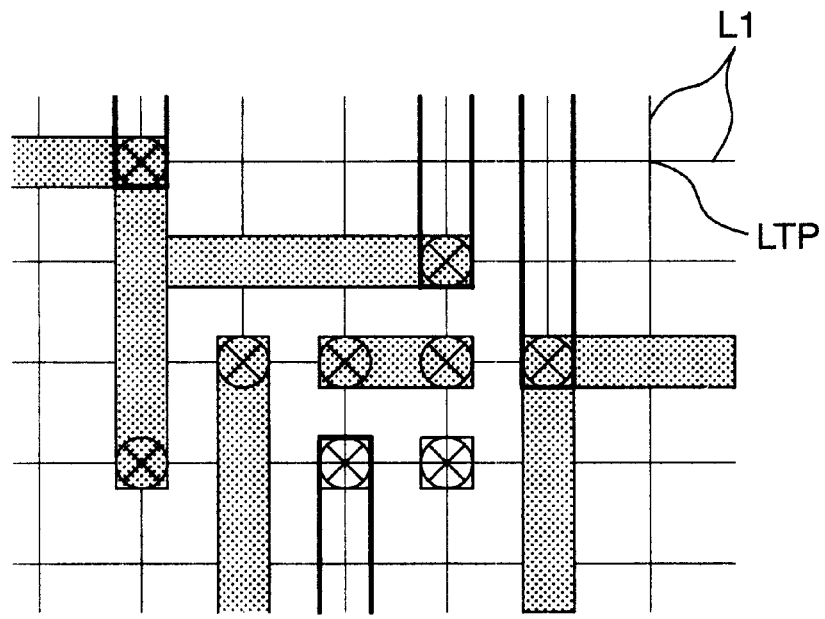
FIG. 3 is diagram for explaining planar features of a typical wiring pattern.
Figure 3:
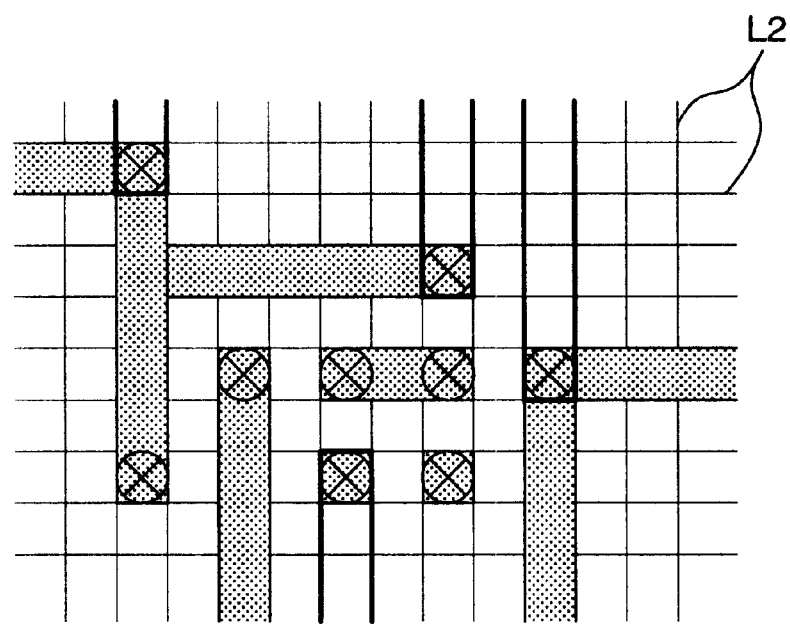

Explanation will first be made as to a circuit pattern to be formed in the present invention and LSI presuppositions therefor. The circuit pattern of a logic LSI, in particular, its wiring pattern is called random pattern, but it is not a completely random pattern. In many cases, the random pattern is arranged according to certain rules which follow, as shown by an upper diagram in FIG. 3. That is, "The pattern is arranged so that grid points LPT on grids L1 are connected at a constant pitch (period)". The condition is called CND1. The present invention treats such a pattern as arranged in this manner in principle. The grids L1 are not always required to have an identical pitch, but in many cases, usually have constant pitches in its vertical and horizontal directions. Further, a minimum interconnect width is usually about half of the pitch. A wiring end LE is usually connected with a via hole leading to an upper or lower wiring layer or a diffusion layer. Accordingly, the wiring line ends LE, and intersections CRS and corners CNR of vertical and horizontal wiring lines are present, in principle, on the grid points LPT. The wiring pattern is arranged so that these wiring ends, intersections and corners of vertical and horizontal wiring lines are connected along grids.

The above condition can be generalized as follows. Consider first a grid L2 has a period (pitch) corresponding to half of the period of the grid L1 both in its vertical and horizontal directions and their grid point is shifted in the vertical and horizontal directions by half of the half of the above pitch as shown by a lower diagram in FIG. 3. At this time, it is assumed that "a pattern is generated by arbitrarily combining minimum unit figures generated by the grids L2". This condition is called the CND0. Many various patterns including a wiring pattern having a wide-width wiring line and an active layer of a custom LSI having a complex shape as a non-wiring pattern are designed according to the CND0.

The present invention can employ the alternating phase-shifting mask method by effectively utilizing these properties.

In these years, the circuit patterns of most logic LSI's are designed by automatic layout wiring, in which case the aforementioned conditions are satisfied in many cases. However, it is not necessarily required to completely satisfy these assumptions. For example, it is actually often that the line width of a geometrical pattern does not coincides with the period of the grid L2 or edges of the geometrical pattern does not coincide with the grid L2. Even in such a case, however, the present invention can be applied thereto, so long as the geometrical pattern is generated by moving the edges of the figure generated by grids according to a certain rule. Further, when a region such as a memory block, to which it is difficult for the present invention to be applied, is present on a chip, the present invention cannot be applied to the region.

Next, explanation will be made as to the principle of a most general exposure method by referring to FIGS. 4 and 5. For simplicity, it is assumed that the minimum line width W of a pattern is equal to the pitch of the grid L2.

Figure 4:
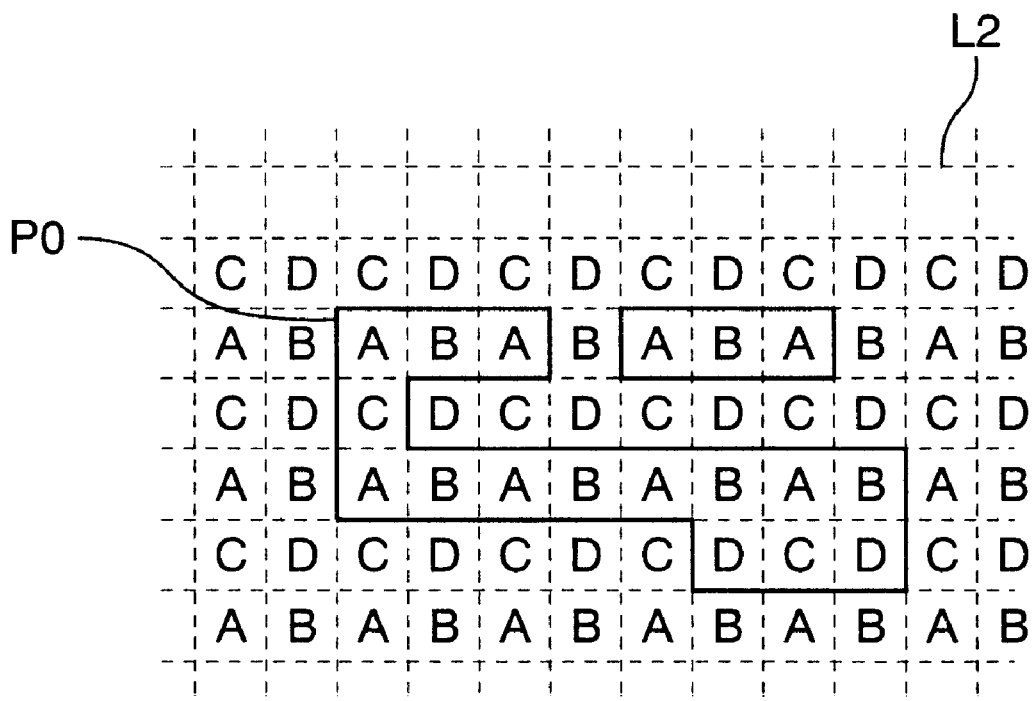
FIG. 4 is a diagram showing a general principle of the present invention.
Figure 4:
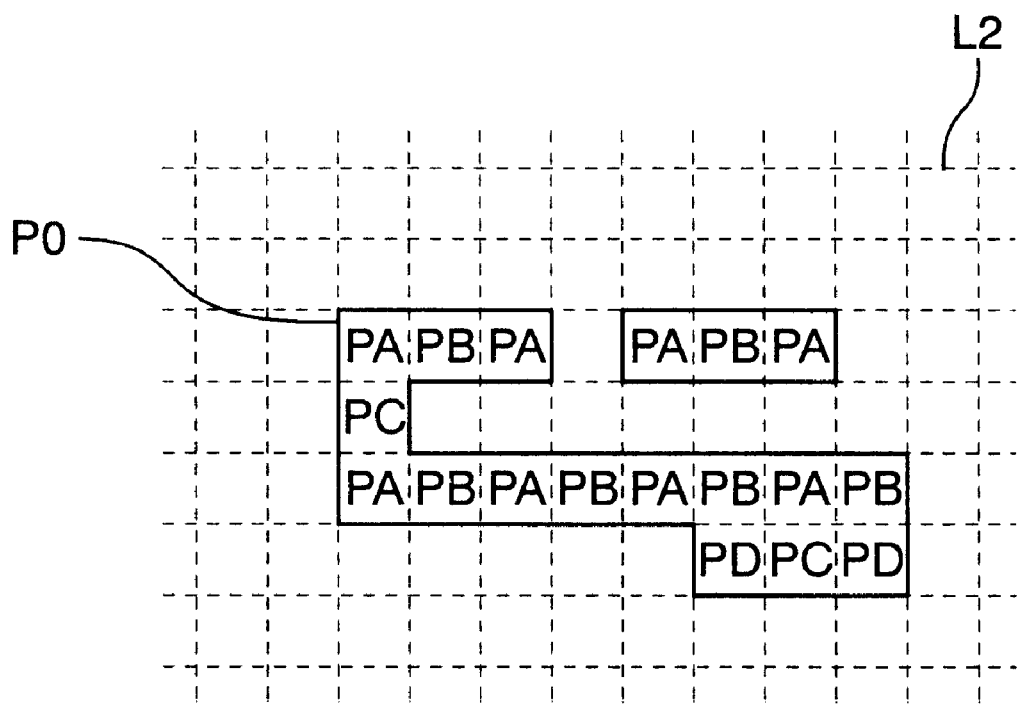

First, an entire region of an interest is divided into four sorts of partial regions according to a procedure which follows, as shown by an upper diagram in FIG. 4. Consider four adjacent rectangles A, B, C and D in the grid L2 to be one basic unit. In each basic unit, the rectangle A contains the grid point LPT of the grid L1, the rectangle B is sandwiched by the rectangle A in its basic unit and by the rectangle A included in a basic unit adjacent thereto in the horizontal direction, the rectangle C is sandwiched by the rectangle A in its basic unit and by the rectangle A included in a basic unit adjacent thereto in the vertical direction, and the rectangle D is the remainder. In this way, the entire region in question is divided into the four sorts of partial regions.

A desired pattern PO satisfying the condition CND0 is then divided into four partial figures based on the above region divided result. That is, the pattern PO is present always on the rectangles A, B, C and/or D. Thus, the pattern P is divided into four sorts of subregions PA, PB, PC and PD by extracting the rectangles A, B, C and D from the region, as shown by a lower diagram in FIG. 4. When the subregions PA, PB, PC and PD are added together, the original pattern P is obtained.

Figure 5:
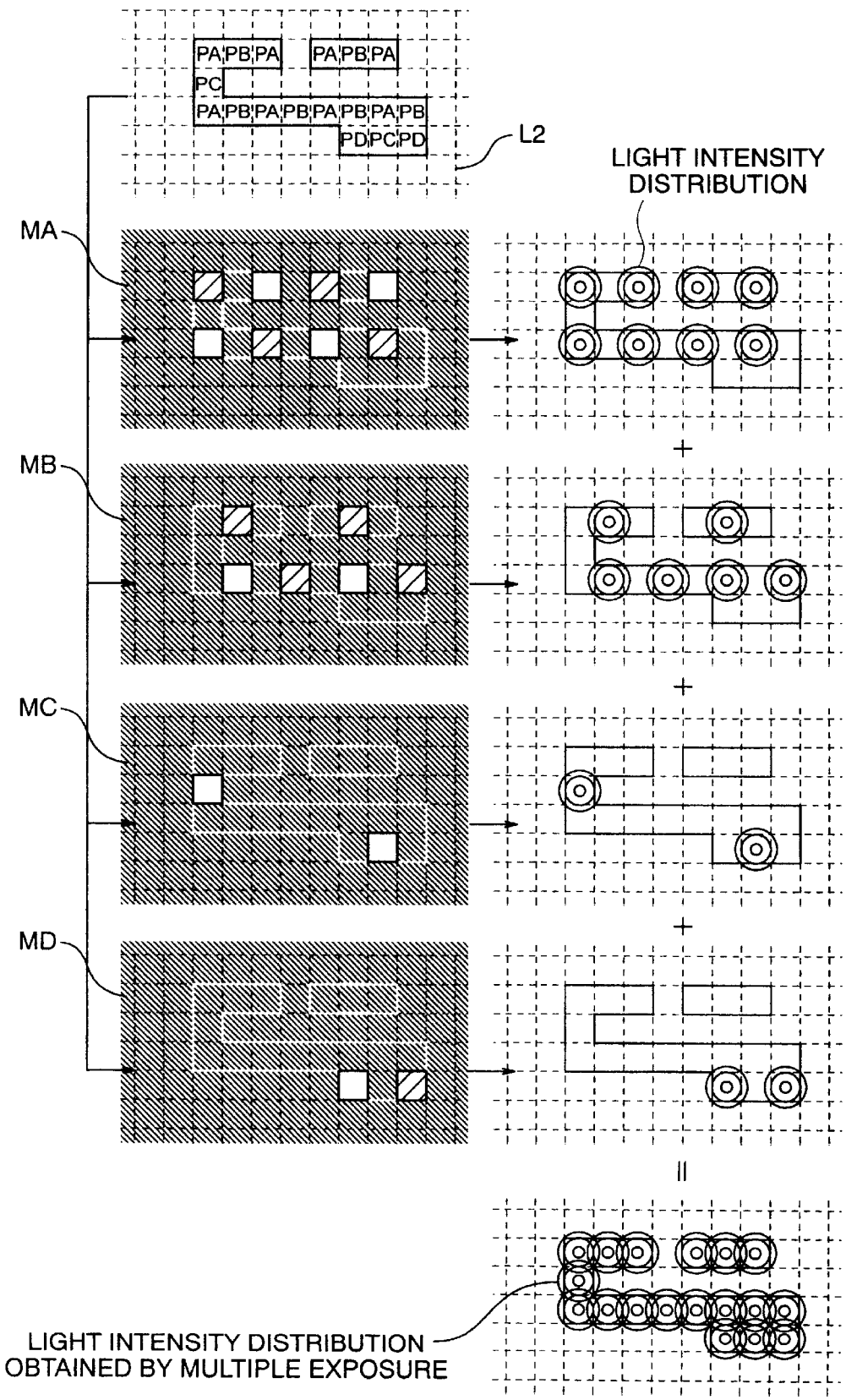
FIG. 5 is a diagram showing the general principle of the present invention.

It is next assumed that a first mask MSK-A denotes such a mask that has openings corresponding to the subregions PA and that the phases of light passed through openings adjacent in their vertical and horizontal directions are mutually inverted (refer to FIG. 5). Similarly it is assumed that second, third and fourth masks MSK-B, MSK-C and MSK-D denote such masks that have openings corresponding to the subregions PB, PC and PD and that the phases of light passed though openings adjacent thereto in the vertical and horizontal directions are mutually inverted respectively (given in a left side of FIG. 5).

For simplicity of explanation, consider first cases where the first, second, third and fourth masks are individually exposed. When exposure is carried out with use of the first mask, areas corresponding to subregions PA are exposed to form a pattern (see a right side in FIG. 5). Similarly, when exposure is carried out with use of the second, third and fourth masks, areas corresponding to the subregions PB, PC and PD are exposed to form patterns respectively (see the right side in FIG. 5). Thus, when exposure is carried out on an identical resist film with use of the first, second, third and fourth masks, areas on the resist film corresponding to the subregions PA, PB, PC and PD are exposed (see a lower part in FIG. 5). Since the addition of the subregions PA, PB, PC and PD results in the original pattern PO as already explained above, the resultant pattern corresponds to the desired wiring pattern PO.

Since the phases of light passed through adjacent openings in each of the subregions PA, PB, PC and PD are mutually inverted, a resolution performance obtained by a so-called alternating phase-shifting mask method can be obtained. That is, a possible minimum resolution distance between adjacent openings, when a classical optical system, e.g., having a numerical aperture of 0.6 and using a KrF excimer laser light source, is obtained as follows.

(2×0.3×wavelength)/(numerical aperture)=2×0.3×0.248/0.6=0.248 μm

The distance is equal to the pitch of the resultant wiring pattern obtained, as will be seen from FIG. 5.

In the foregoing explanation, any of the conditions other than the condition CND0 is not applied to the pattern PO. Accordingly, even for a wiring pattern having any shape, a resolution obtained by the alternating phase-shifting mask method can be realized, so long as the pattern is formed according to the above method and satisfies the condition CND0. When the geometrical pattern satisfies the condition CND1, in particular, the geometrical pattern passes through the grid point LPT of the gird L1 and extends in vertical and horizontal directions, so that the existence region of the pattern is always on the basic units A, B or C. Accordingly, the mask MSK-D becomes unnecessary and the pattern can be formed with use of only the three masks. when the pattern is of a one-dimensional type, it is clear that the pattern can be formed with use of the two masks.

In this connection, the subregions PA, PB, PC and PD each have generally a rectangle due to one element of the grid L2, but its exposure distribution actually obtained by the exposure is somewhat rounded due to refraction. However, since their rounded light intensity distributions are mutually overlapped, a substantially linear wiring pattern can be obtained except for interconnect ends, corners or the like.

Since grid points present at line ends or corners are exposed with independent masks, problems of shrinkage of line ends, rounded corners and so on can be reduced, which is a secondary effect of the present invention.

As a result of pattern division, such an isolated pattern as shown by the mask MSK-C in FIG. 5 is sometimes generated. Since the phase-shifting effect cannot be expected for such a pattern, its light intensity distribution generated by exposure is expanded more outwardly than a light intensity distribution of the openings which can receive the phase shifting effect. As a result, there may occur such a situation that a final pattern generated by the multiple exposure has a broadened pattern width at the corresponding parts. However, the fact that the pattern division resulted in generation of an isolated pattern means the fact that there is no pattern closed thereto. Thus even when the pattern was broadened at the corresponding parts, there will occur no short-circuiting problem of the pattern with adjacent pattern thereto. And when the present invention is applied to a wiring layer, this will not involve mostly any problems with electrical characteristic and circuit function. Meanwhile, light intensities may vary between the opening pattern receiving the phase-shifting-effect and the isolated opening pattern depending on illumination conditions at the time of exposure, even when the openings have the same dimensions. In this case, it is preferable to take a measure against it, for example, by expanding the dimensions of the isolated opening. Although explanation has been made in connection with the pattern isolated in vertical and horizontal directions in the foregoing, the same holds true even for expansion of a pattern in a direction of absence of an adjacent pattern.

The above explanation has been made in connection with the simplest form of the principle of the present invention, not a practical application form. In other words, when some of the four masks are replaced by a one-dimensional alternating phase-shifting mask or a half-tone type phase-shifting mask, the mask pattern can be simplified or the number of masks necessary for multiple exposure can be reduced, examples of which will be explained in specific embodiments which follow.

(Embodiment 1)

Figure 6:
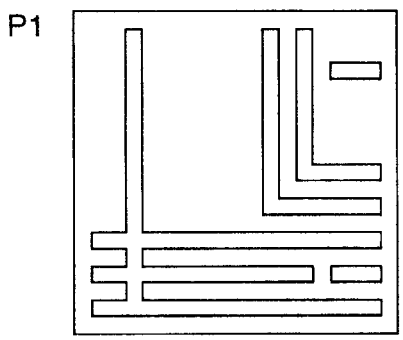
FIG. 6 is a diagram showing how to generate mask patterns for formation of a wiring pattern in accordance with an embodiment of the present invention.
Figure 6:
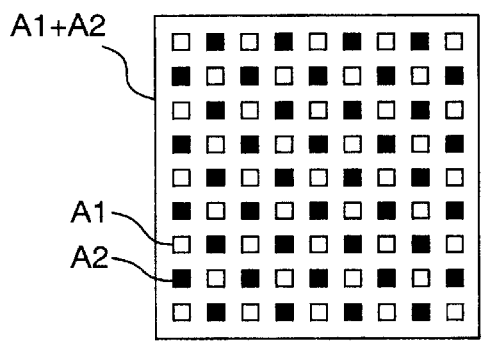
Figure 6:
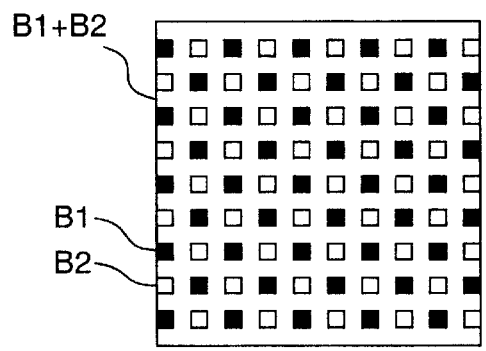
Figure 6:
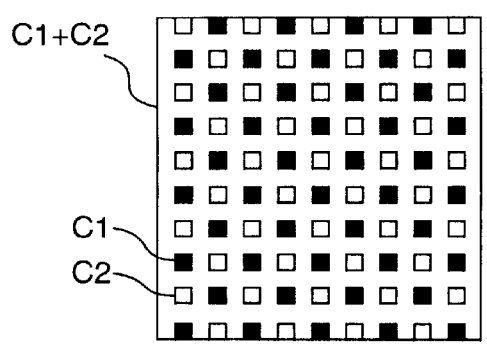
Figure 6:
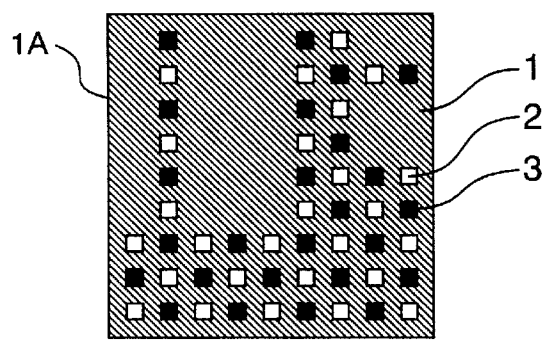
Figure 6:
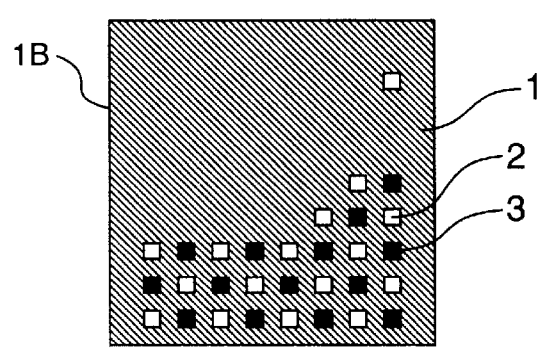
Figure 6:
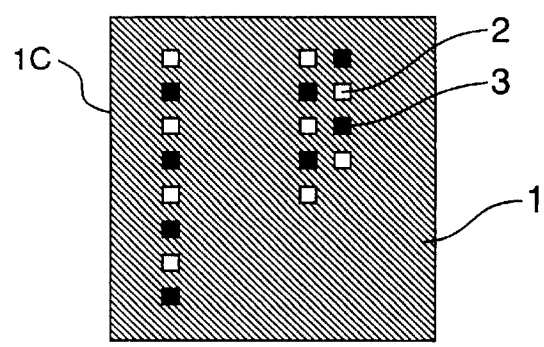

Explanation will be made with reference to FIG. 6 in connection with an example wherein the method explained in the article 'Effects' is applied to form a 0.3 μm-pitch wiring layer pattern.

For a designed 0.3 μm-pitch wiring layer pattern P1, first of all, three masks were prepared according to the method explained in FIG. 5. As pattern data processing for the above, a so-called geometrical operation tool for mask data processing was used. First, figures A1, A2, B1, B2, C1 and C2 arranged in the form of a checker flag are prepared as shown in FIG. 6. Next, when a common part between the figure Al and a wiring pattern P1 is calculated, opening patterns 2 corresponding to a phase of 0 degrees are generated in a light shielding part 1 of the first mask 1A. When a common part between the figure A2 and wiring pattern P1 is then calculated, opening patterns 3 corresponding to a phase of 180 degrees are generated in the light shielding part of the mask 1A. By previously preparing the figures A1 and A2 in this way, a phase-shifting mask can be generated through highly simple geometrical operation. The same holds true even for the second and third masks 1B and 1C. Next three phase-shifting masks were manufactured with use of data of the generated opening patterns broadened by a predetermined amount (broadened in vertical and horizontal directions by a constant amount) (refer to a lower part in FIG. 6). As the structure of the phase-shifting masks, the structure generally already known was employed.

Figure 7:
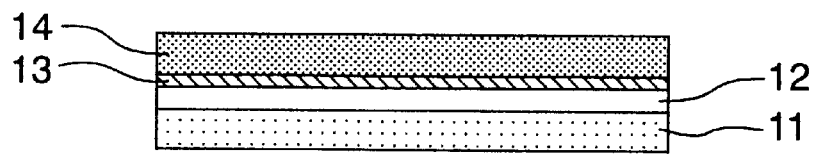
FIG. 7 shows steps of forming a wiring layer in accordance with an embodiment of the present invention.
Figure 7:
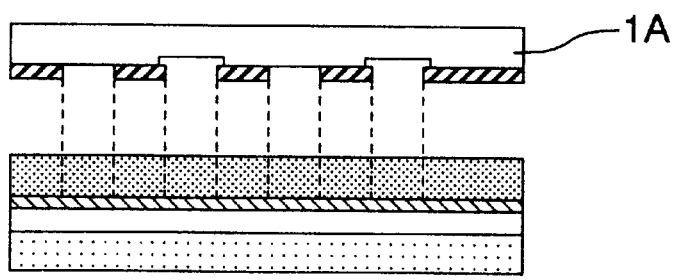
Figure 7:
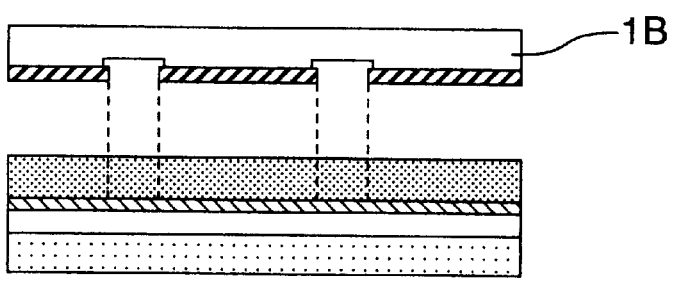
Figure 7:
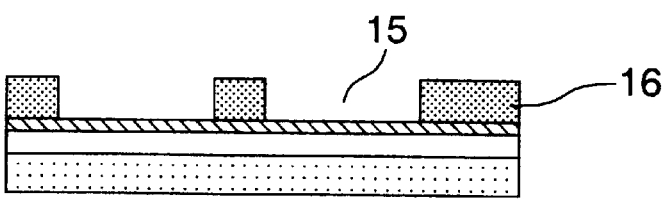
Figure 7:
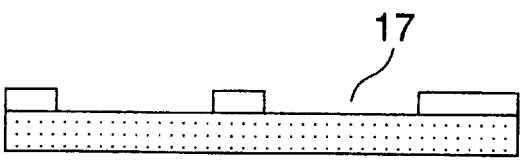
Figure 7:
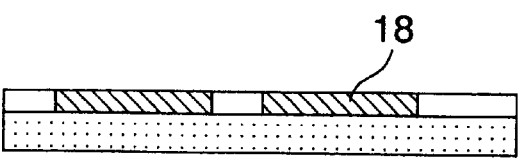
Figure 8:
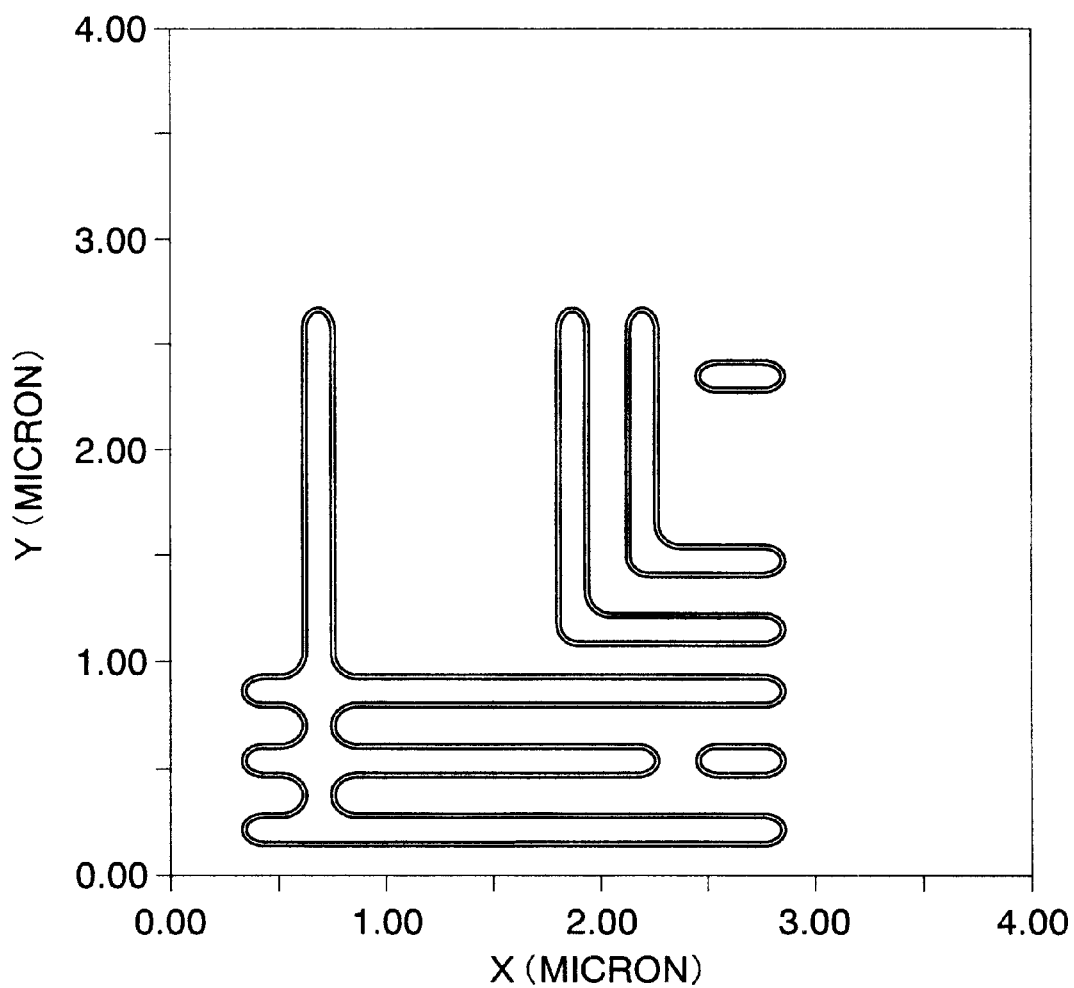
FIG. 8 shows characteristics of a wiring pattern formed in accordance with an embodiment of the present invention.

Explanation will next be made as to a process of forming a wiring pattern using the aforementioned masks by referring to FIG. 7. An Si oxide film 12 was deposited on a predetermined LSI substrate 11, a predetermined antireflection layer 13 was coated on the Si oxide film 12, and then a positive resist 14 for a KrF excimer laser was coated on the anti-reflection layer 13 (refer to a first step in FIG. 7). A predetermined aligning mark (not shown) is formed on the substrate. Subsequently, the first mask 1A was aligned to the aligning marks and then exposed (refer to a second step in FIG. 7). For the exposure, a reduction projection exposure apparatus exposure (not shown) using a KrF excimer laser as a light source was used. The second mask 1B and third mask 1C were aligned to the positive resist 14 and sequentially exposed (see a third step in FIG. 7, but an exposure step of the third mask 1C not shown). FIG. 8 shows a two-dimensional (planar) distribution of a total of light illuminated on the resist film by multiple exposure. An optical-chemical reaction takes place in the resist according to the amount of illuminated light, whereby the solubility of the resist is changed and a pattern is formed by development. The soluble reaction was made to occur in the resist with a shape nearly conforming to a designed pattern. Thereafter the resist film was developed. As a result, the resist film was removed from an area 15 where a desired wiring pattern is to be formed (see a fourth step in FIG. 7). The anti-reflection film and oxide film were etched with use of a resist pattern 16 next formed as a mask, after which the resist and anti-reflection film were removed to make grooves 17 in the oxide film in the desired-wiring-pattern formation area (see a fifth step in FIG. 7). Thereafter barrier metal such as copper as wiring materials was buried in the grooves, the surface thereof was polished by chemical-mechanical polishing (CMP) to leave only the grooves thereon and to form a desired wiring pattern 18 (see a sixth step in FIG. 7).

The wiring pattern, exposure apparatus type, resist process, wiring formation process, and so on are not limited to the specific examples explained in the present embodiment. For example, an Al wiring pattern may be formed by forming a hard mask and an anti-reflection film using an i-ray reduction projection exposure apparatus on an Al film, coating a negative resist thereon, multiple-exposing and developing three masks, and etching its underlying layer with use of its obtained resist pattern as a mask. Further, the exposing sequence of the three masks may be changed.

(Embodiment 2)

In the method shown in the above Embodiment 1, the one-dimensional pattern has entirely been decomposed into a set of fine dot patterns, although the one-dimensional pattern can be treated sufficiently by a simple one-dimensional alternating phase-shifting mask method. However, this is not preferable from the viewpoint of saving of the amount of pattern data. Explanation will be made herein in connection with an example of a mask pattern decomposition method different from in the Embodiment 1.

When the alternating phase-shifting mask method is applied to a pattern satisfying the condition CND1, phase conflict parts can be determined to be always the vicinities of line ends LE, line intersections CRS and corners CNR. In the sense that these parts LE, CRS and CNR correspond to connection points with via holes or between vertical and horizontal lines, the LE, CRS and CNR will be called "connection nodes" hereinafter. Accordingly, phase conflict can be solved between these connection nodes or between the connection nodes and other patterns. Areas of the wiring pattern other than the vicinities of the connection nodes are simple line patterns, to which a usual one-dimensional alternating phase-shifting mask method can be applied and a general pattern decomposing procedure is as follows.

(1) Extraction of a phase conflict point. Its peripheral region is decomposed into a plurality of (four in maximum) masks according to the procedure of FIG. 5.

(2) Extraction of a pattern in a horizontal direction other than the above region. A one-dimensional alternating phase-shifting mask method is applied thereto to obtain a fifth mask.

(3) Extraction of a pattern in a vertical direction. The one-dimensional alternating phase-shifting mask method is applied thereto to obtain a sixth mask.

Figure 9:
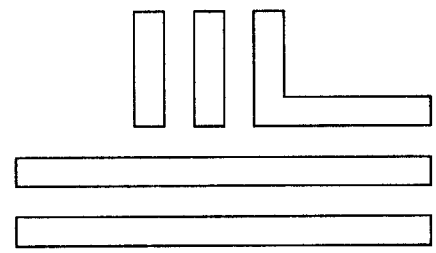
FIG. 9 shows a wiring pattern in accordance with an embodiment of the present invention and mask patterns for formation thereof.
Figure 9:
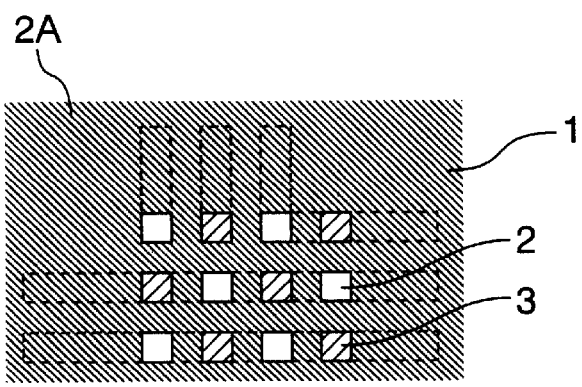
Figure 9:
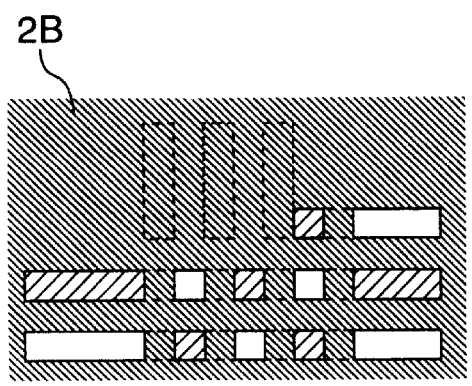
Figure 9:
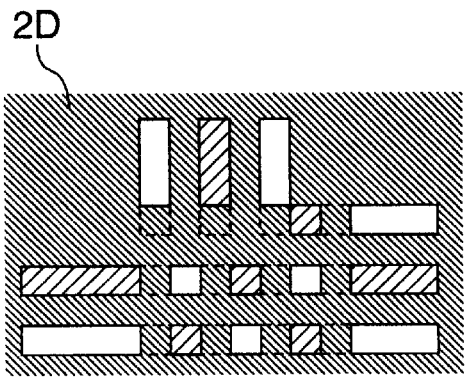
Figure 9:
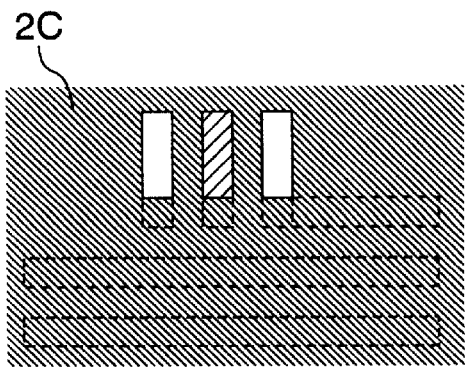

In this way, this method generally requires a maximum of 6 masks, but in practice, some of the six masks may, in many cases, be commonly used to be present on an identical mask without involving any troubles. For example, for a pattern shown in an upper part of FIG. 9, three mask patterns such as 2A, 2B and 2C can be generated. The mask pattern 2B corresponds to the mask pattern 1B in the Embodiment 1, but it is only its center of the pattern that is decomposed into dot-like patterns, and one-dimensional line patterns extended therefrom to both sides are simple, alternating, and one-dimensional phase-shifting masks. The same holds true for the mask pattern 2C. Further, in the case of the pattern shown in FIG. 9, the mask patterns 2B and 2C can be combined on an identical mask into such a mask pattern 2D (, which is not always possible). In order to keep equal the phases of one-dimensional line patterns on both sides of a two-dimensional pattern decomposition region in the vicinity of a connection node (which region will be referred to as the quantization region, hereinafter), it is preferable that the quantization region include an even number of square units each of A, B, C and D in FIG. 4 in each of vertical and horizontal directions.

Although the pattern decomposition has been manually carried out in the present embodiment, it may be carried out automatically, which will be explained in connection with Embodiments 3 and 4. However, in some cases, manual region decomposition may be effective. For example, when the existence regions of one-dimensional pattern and two-dimensional pattern are separated from each other clearly on design as will be explained in Embodiment 10, the interaction between the fourth or fifth mask and the pattern on the mask generated in the above article (1) can be prevented. Thus, it is relatively easy to position the pattern on the fourth or fifth mask on the mask generated by the article (1).

(Embodiment 3)

In the above Embodiment 2, the designer must manually assign a region to which the three-mask decomposition used in the method of the Embodiment 1 is to be applied as well as a region to which the one-dimensional alternating phase-shifting mask method is to be applied. The present embodiment shows how to automatically carry out the above region assignment. In the present embodiment, further, the number of masks generated can be suppressed to 3 or less.

As already explained above, a conflict point occurs in the vicinity of a connection node. A mask is generated by extracting a pair of mutually-conflicting connection nodes of grid points included in a neighboring figure conflicting with the connection node, which is nearest to the connection node, and by using the both as phase-inverted openings. Next, a mask is generated by extracting only a horizontal pattern from an original pattern P3, subtracting opening patterns from the pattern, and assigning the opening patterns in the vertical direction in a one-dimensional alternating phase-shifting manner. Similarly, a mask is generated by extracting only vertical patterns from the original pattern and subtracting the opening patterns of the mask from the vertical patterns, and assigning the opening patterns in the one-dimensional alternating phase-shifting manner. If possible, the masks may be combined into an identical mask.

(Embodiment 4)

A problem with the Embodiment 3 is that, for example, when the light transmission region of a phase-conflict part is formed as another mask, a relation between the former region and another light transmission region which has so far had an effective phase shifting effect without initially causing any phase conflict becomes an incoherent summation, thus conversely vanishing the phase shifting effect.

This problem can be solved by including even grid points of a broader region around the connection node in the mask. In this case, the grid points around the connection node will be referred to as "peripheral nodes" hereinafter. The role of the peripheral node is to suppress the spread of the light intensity distribution of the connection node in its all directions, and the influence of the peripheral node itself must be made as small as possible. To this end, it is desirable to optimize the dimensions of the peripheral node. Similarly to the connection node, the peripheral node may or may not be subtracted from the original pattern.

In general, phase conflict extraction requires a time. Thus the processing of the Embodiment 3 and the present embodiment may be applied equally to all the connection nodes independent of the conflict.

Figure 10:
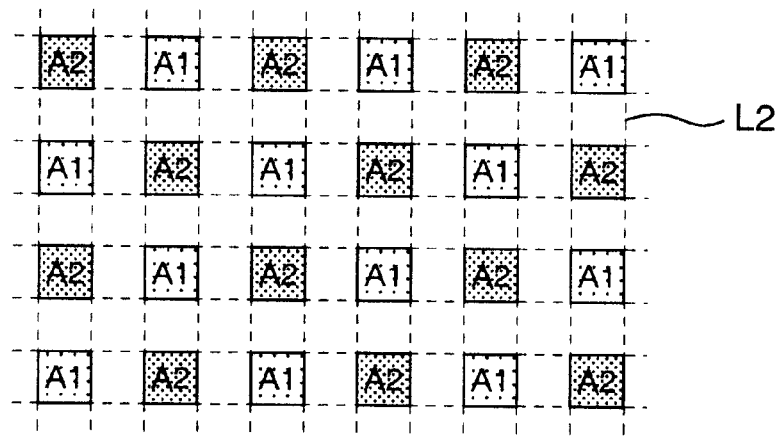
FIG. 10 shows a principle of another embodiment of the present invention.
Figure 10:
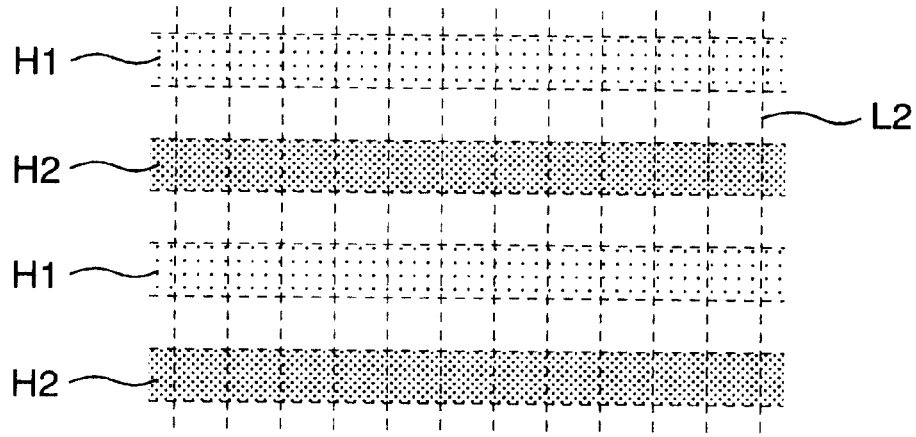
Figure 10:
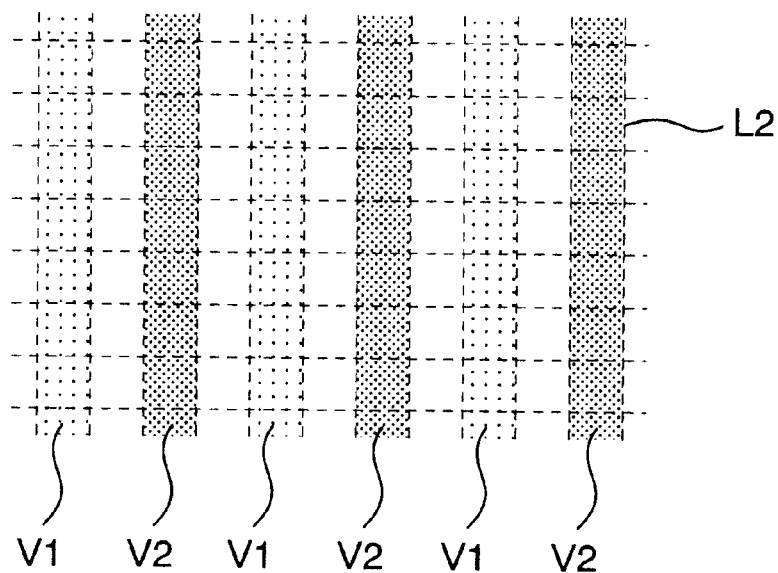
Figure 11:
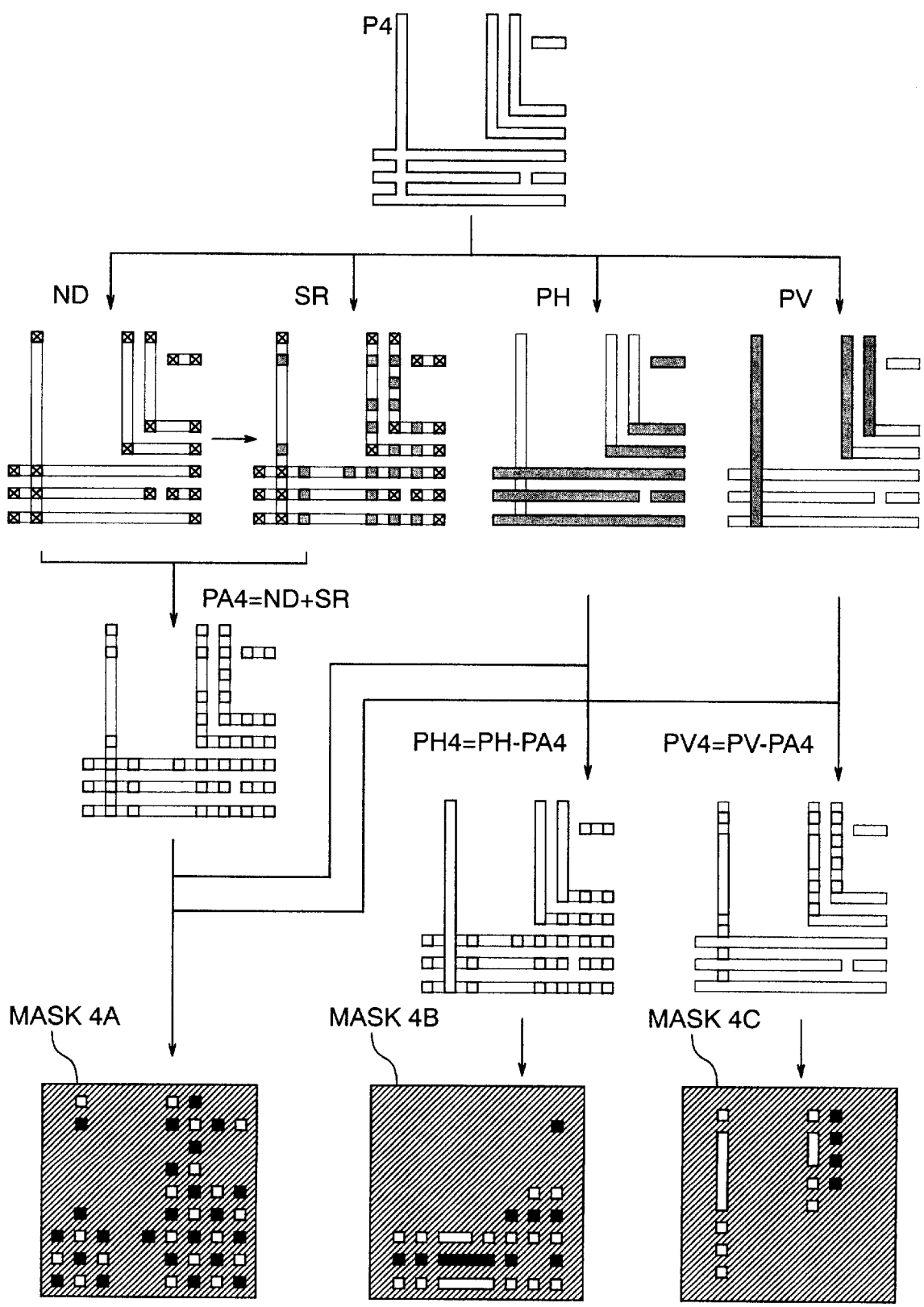
FIG. 11 is a diagram for explaining how to generate mask patterns for formation of a wiring pattern in accordance with another embodiment of the present invention.

Explanation will be made as to a general pattern generation method by referring to FIGS. 10 and 11. First, all the region in question, similarly to FIG. 6, is decomposed into subregions A1 and A2 I a checker-flag shape with use of a grid L2, and further, as shown in FIG. 10, is decomposed into strips H1 and H2 in a horizontal direction and into strips V1 and V2 in a vertical direction. Meanwhile, a vertical pattern PV, a horizontal pattern PH, a connection node ND and a peripheral node SR are extracted from an objective pattern P4, as shown in FIG. 11. In this case, the vertical and horizontal patterns can be judged, for example, by comparing vertical and horizontal coordinate values of grid points connecting wiring lines therein. The connection node ND corresponds to an addition of wiring line ends LE, intersections CRS of the vertical and horizontal patterns, and corners CNR, suitably selected. The peripheral nodes SR are ones of the nearest grid points (nodes) of the connection nodes ND included in the pattern P. Next the connection nodes ND or the connection nodes ND and peripheral nodes SR are added to form a pattern PA4, and common regions of the pattern PA4 and A1 or A2 are removed to be used as openings of phases of 0 and 180 degrees in a mask 4A. The horizontal pattern PH or ones of connection nodes subtracted only by their suitable types from the horizontal pattern PH are formed as a pattern PH4. And common regions of the pattern PH4 and strips H1 or H2 are removed to form openings of phases of 0 and 180 degrees in a mask 4B. Similarly, the vertical pattern PV or ones of connection nodes subtracted only by their suitable types from the vertical pattern PV are formed as a pattern PV4, and common regions of the pattern PV4 and strips V1 or V2 are removed to form openings of phases of 0 and 180 degrees in a mask 4C.

The pattern PA4 is made up of squares having one side corresponding to a minimum line width W of wiring lines and arranged with a period of a minimum 2W, so that the masks 4B and 4C obtained when the pattern PA4 is subtracted from the horizontal pattern PH and vertical pattern PV have a width gap of about W. However, the phases on both sides of the gap are equal. In this case, since the gap is usually is below the limit of the resolution, patterns are substantially connected to each other (which causes phase conflict when judged based on prior criteria). Accordingly it is not necessarily required to subtract the pattern PA4 for such a part. Further, even for line ends of the horizontal or vertical pattern PH or PV, when the line ends are greatly influenced by line shrinkage, it is not necessarily required to subtract the pattern PA4. That is, the horizontal or vertical pattern PH or PV subjected to phase assignment may be used as the masks 4B and 4C, respectively. As mentioned above, the connection nodes ND to be included in the mask 4A may include, in addition to the wiring line ends LE, any combination of the intersections CRS and corners CNR. The connection nodes to be subtracted from the vertical and horizontal patterns PV and PH may be selected from any of the wiring line ends LE, intersections CRS and corners CNR. Accordingly such combinations as shown in Tables 1 and 2, which are given below, are considered.

TABLE 1

Exemplary combinations to be included in PA4

|   | LE | CNR, CRS | SR |
|---|----|----|----|
| 1 | ○ |    |    |
| 2 | ○ | ○ |    |
| 3 | ○ |    | ○ |
| 4 | ○ | ○ | ○ |

TABLE 2

Exemplary combinations to be subtracted from PH or PV at the time of generating PH4 or PV4

|   | LE | CNR, CRS | SR |
|---|----|----|----|
| 1 |    |    |    |
| 2 | ○ |    |    |
| 3 | ○ | ○ |    |
| 4 | ○ |    | ○ |
| 5 | ○ | ○ | ○ |

FIG. 11 corresponds to #4 in Table 1 and #5 in Table 2.

On the masks 4B and 4C where the pattern PA4 was subtracted from the vertical pattern PV, there are openings having various lengths (from a minimum W to the longer side of the longest chip) with respect to the width of about W. The light intensity of each opening varies depending on its length. Thus, for the purpose of making the light intensities of the openings as equal as possible, it is preferable to adjust the width or the like according to the lengths of the openings. For example, it is considered to equally enlarge ones of the openings close in shape to squares. Preferably, these feature size corrections are individually optimized to each of the combinations in Tables 1 and 2.

Figure 12:
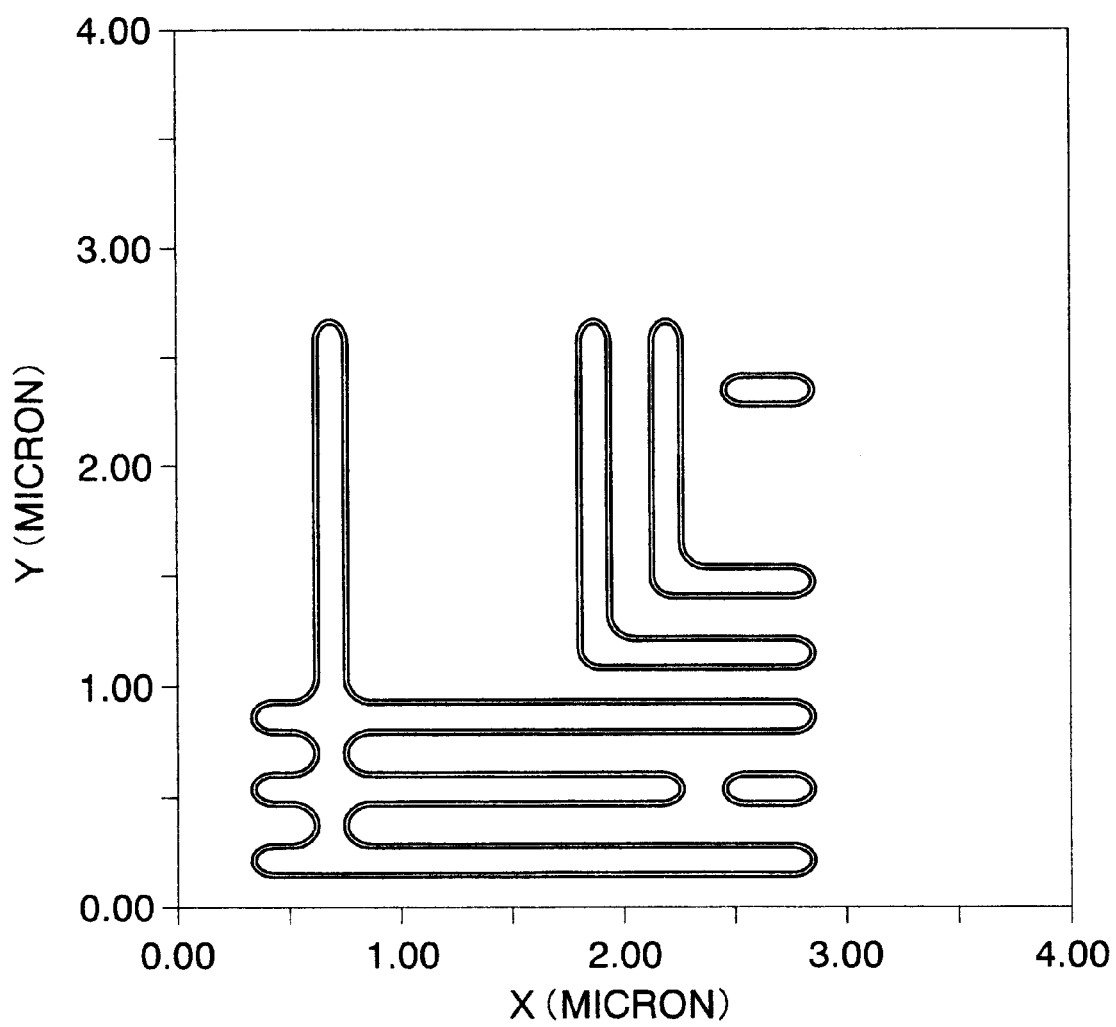
FIG. 12 shows characteristics of the wiring pattern formed in accordance with another embodiment of the present invention.

FIG. 12 is an accumulated exposure dose distribution obtained when three masks, which are generated by adding the wiring line ends LE and peripheral nodes SR located above/below and on right/left sides to form the pattern PA4 (corresponding to 3 in Table 1) and by subtracting half of the wiring line end LE from the vertical patterns PV and PH to form the patterns PH4 and PV4 respectively (an intermediate between Tables 1 and 2, that is, by shortening the line end by half of the line width in a line length direction) with respect to the designed pattern of FIG. 11 (having a line width of 0.15 $\mu$m and a line period of 0.3 $\mu$m), are multiple-exposed (using a KrF excimer laser exposure apparatus with an numerical aperture NA of 0.6). Openings corresponding to the wiring line ends LE of the pattern PA4 were set to be a 0.21 $\mu$m square, while openings corresponding to the peripheral nodes SR were set to be a 0.15 $\mu$m square.
(Embodiment 5)

Explanation will be made in connection with an example wherein the present invention is applied to a second wiring layer of a logic LSI. The second wiring layer formed by an automatic layout wiring method based on a channel technique is of a one-dimensional type as shown in the uppermost part in FIG. 13. Accordingly no figures exist on the subregions C and D in FIG. 4 and masks corresponding to the masks MSK-C and MSK-D in FIG. 5 become unnecessary. That is, this pattern can be formed with use of two masks.

Figure 13:
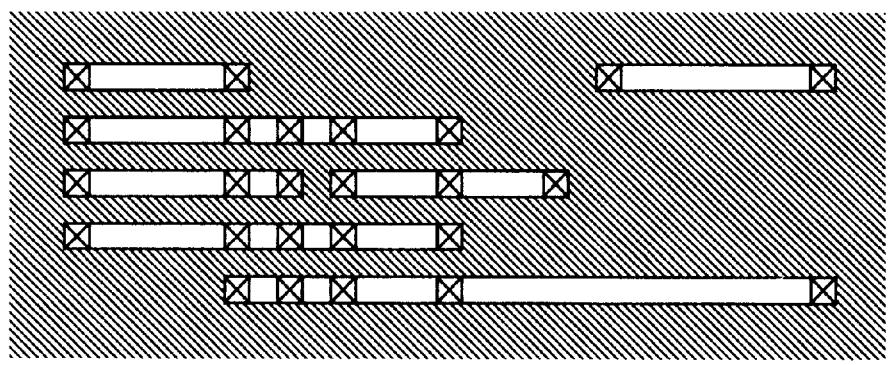
FIG. 13 shows a wiring pattern in accordance with another embodiment of the present invention and mask patterns for formation thereof.
Figure 13:
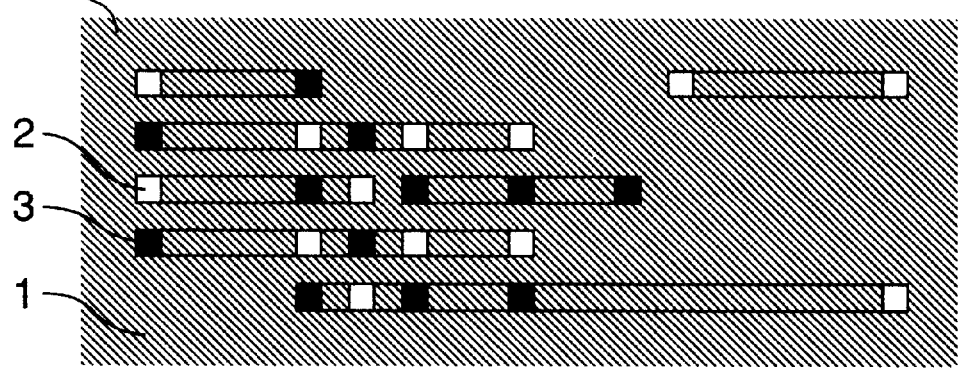
Figure 13:
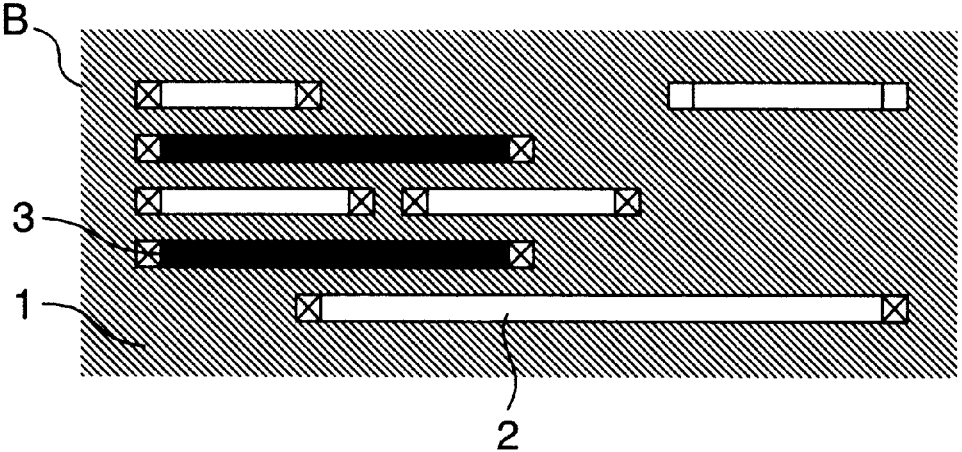

In the case of such a one-dimensional wiring pattern, it is often effective to use a technique for decomposing the pattern into the connection nodes (or connection nodes and their peripheral nodes) shown in Embodiment 2, 3 or 4 and the other part through the complete pattern decomposition explained in FIG. 5 or Embodiment 1. In this case, it is only required to consider only the line ends as the connection nodes. Thus in the case of such a pattern extended in its horizontal direction as shown in FIG. 13, it is only required to consider only two grid points above and below the wiring line end as the peripheral nodes. More grid points may be considered as the peripheral nodes, as necessary. Two masks 5A and 5B generated in this manner are shown as an example in middle and lower parts of FIG. 13.

(Embodiment 6)

In the present embodiment, explanation will be made in connection with an example wherein the present invention is applied to a case where wide-width wiring lines for reduction of wiring resistance are used in the same layer as minimum-width lines. It will be obvious that, even when a wide-width wiring line is present, the pattern can be formed according to the general method shown in FIG. 5, so long as it meets the condition CND0. In this case, however, four masks are generally required. Here, an example wherein a wide-width wiring line is realized by a simpler method with use of three masks is shown. In the present embodiment, a wide-width wiring line is defined as by burying an area between a pair of minimum-width wiring lines running parallel to each other on the grid L1. The basic concept of the present embodiment is based on that a central part of wide-width lines running in a horizontal direction is positioned in a mask for formation of minimum-width lines running a vertical direction, while a central part of wide-width lines running in the horizontal direction is positioned in a mask for formation of minimum-width lines running in the horizontal direction. For example, consider a wide-width part running in a horizontal direction in a pattern P6 in FIG. 14. In this case, adjacent one pair of minimum-width wiring lines defining both sides of the wide-width wiring line is included in a mask for exposure of horizontal directional lines (corresponding to the mask 4B in Embodiment 4), whereas a region PHC sandwiched between the pair of wiring lines is included in a mask for exposure of vertical directional lines (corresponding to the mask 4C in Embodiment 4). At this time, since phase conflict may take place when the vertical minimum-width line faces the line end of the region PHC, it is preferable to reduce the length of the region PHC in its longitudinal direction by an amount corresponding to the minimum line width W.

Figure 14:
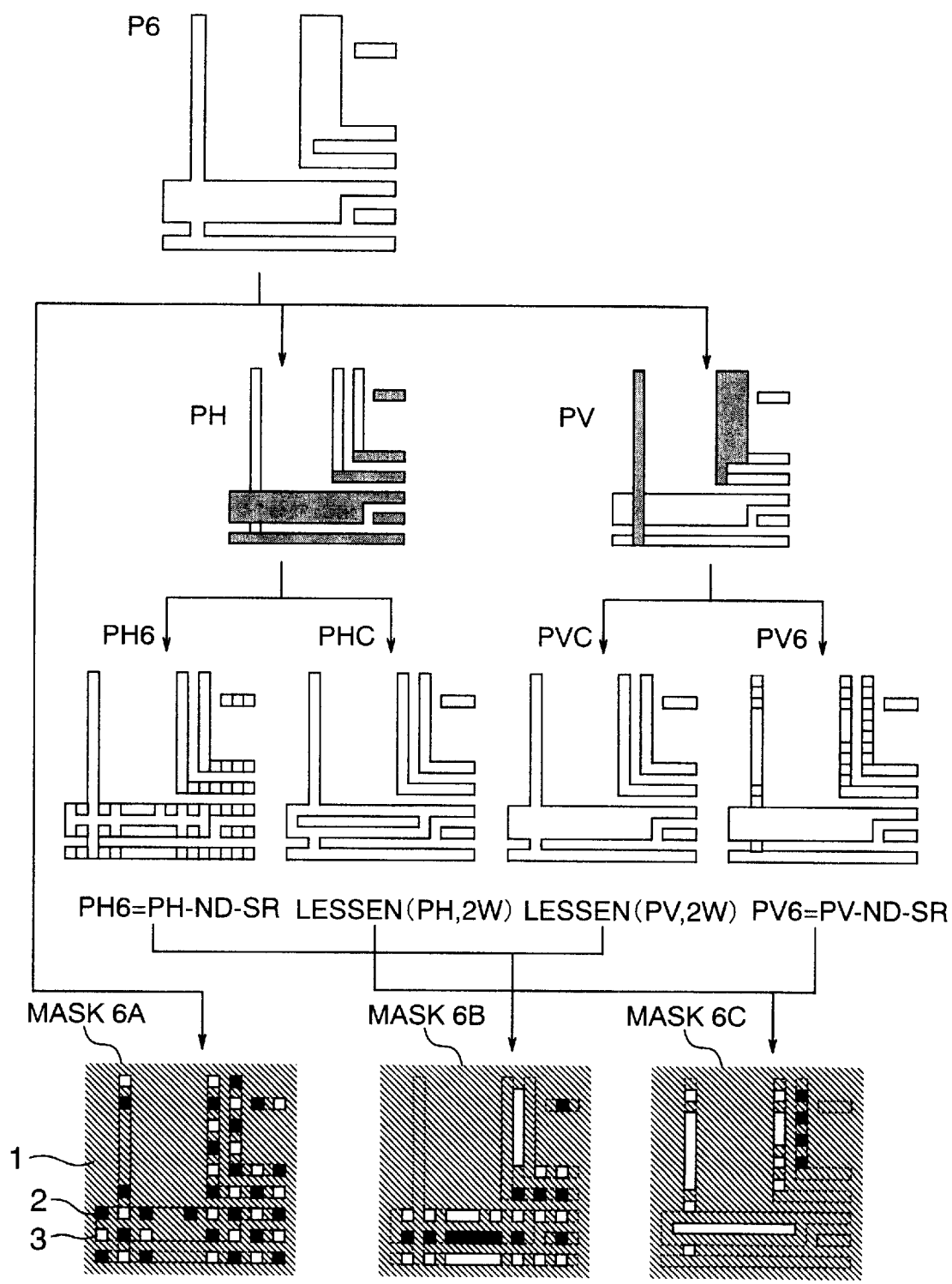
FIG. 14 is a diagram for explaining how to generate mask patterns for formation of a wiring pattern in accordance with another embodiment of the present invention.

Explanation will be made as to the general pattern generating method with use of FIG. 14. First, as in FIG. 10, an entire region in question is decomposed into subregions A1 and A2 in the form of a checker flag, into strips H1 and H2 in a horizontal direction, and into strips V1 and V2 in a vertical direction. As in Embodiment 4, a vertical pattern PV, a horizontal pattern PH, a connection node ND and a peripheral node SR are extracted from the objective pattern P6. Even when a wide-width wiring line is present, as in Embodiment 4, the vertical and horizontal patterns can be judged by comparing vertical and horizontal coordinates values of a grid point connecting the wiring lines. The connection node ND or the connection node ND and peripheral node SR are added to form a pattern PA6, common regions of the pattern PA6 and subregions A1 or A2 are removed to form openings of phases of 0 and 180 degrees in a mask 6A. (Since the generating procedure of the mask 6A is substantially the same as in Embodiment 4, only results are shown in FIG. 14.) Next, the horizontal pattern PH or suitable ones of types of the connection nodes are subtracted from the horizontal pattern PH to form a pattern PH6, and common regions of the pattern PH6 and strips H1 or H2 are removed to form openings of 0 or 180 degrees in a pattern 6B. Further, when a BIAS of a suitable value not smaller than 2W and smaller than 3W with respect to the minimum line width W is set, the vertical pattern PV is lessened by the BIAS and then broadened by an amount of (BIAS-2W); a figure PVC is formed in the central part of the wide-width line running in the vertical direction. The figure PVC is added to the pattern 6B as an opening. The phase may be set to be 0 or 180 degrees. Similarly the vertical pattern PV or suitable ones of types of the connection nodes are subtracted from the vertical pattern PV to form a pattern PV6, and common regions of the pattern PV6 and strips V1 or V2 are removed to form openings of 0 or 180 degrees in a mask 6C. Further, the horizontal pattern PH is lessened by the amount BIAS and then broadened by the amount (BIAS-2W) to form the figure PHC, and the figure PHC is added in the mask 6C as an opening (having an arbitrary phase). As in Embodiment 4, it is preferable on each mask to correct the shape or dimensions of each opening as necessary. Further, the amount of the above broadening amount may be suitably adjusted.

(Embodiment 7)

In the foregoing embodiments, in order to form a complex two-dimensional wiring pattern, it has been generally necessary to multiple-expose three alternating phase-shifting masks. This not necessarily preferable from the viewpoint of throughput or the like. For this reason, it is demanded to reduce the number of masks and the frequency of multiple-exposing times.

To this end, it is first considered to provide vertical and horizontal one-dimensional phase-shifting mask patterns in an identical mask. In this case, however, when the horizontal pattern of a phase of 0 degrees (or 180 degrees) intersects with the vertical pattern of a phase of 180 degrees (or 0 degrees) or conversely when the vertical pattern of a phase of 0 degrees (or 180 degrees) intersects with the horizontal pattern of a phase of 180 degrees (or 0 degrees), this involves a problem that a separation takes place between the both patterns. The separation problem can be solved by providing a pattern for connection of a separation location between the both patterns on a mask for connection node. However, since such a separation location is generally not present on the grid point of the connection node, it is difficult to form a connection node mask pattern without any phase conflict.

To avoid this, in accordance with the present embodiment, a so-called half-tone type phase-shifting mask is employed for the purpose of forming vertical and horizontal patterns at the same time. Together with this mask, further, a so-called modified illumination method is used for the purpose of improving the resolution performance of the half-tone type phase-shifting mask. The half-tone type phase-shifting mask and modified illumination method are discussed, for example, Handbook of Microlithography, Micromachining, and Microfabrication, Vol. 1: Microlithography (SPIE Press, 1997, Bellingham), pp.71–82. When the half-tone type phase-shifting mask method and the modified illumination method are combined, an alternating pattern having a pitch well exceeding the resolution limit of the prior art exposure method, although it is inferior to the alternating phase-shifting mask method. However, the resolution improvement is only in the pattern repetitive direction and the resolution at line ends or corners cannot be improved. Accordingly it is difficult to apply the above combination method as it is, to a random interconnect pattern of a logic LSI. In the present embodiment, this problem is solved by the phase-shifting mask for connection node exposure and by multiple exposure.

Figure 20:
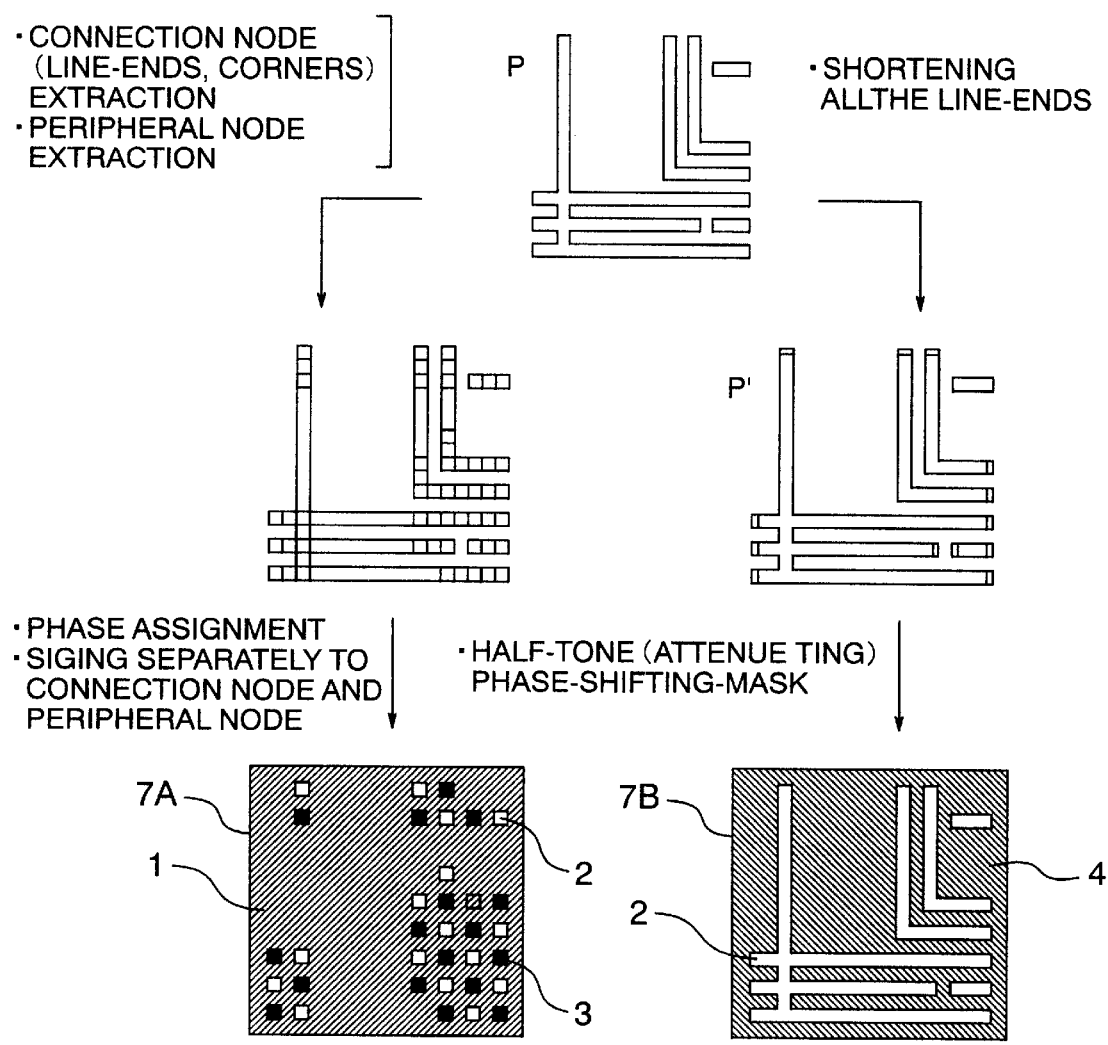
FIG. 20 is a diagram for explaining how to generate mask patterns for formation of a wiring pattern in accordance with another embodiment of the present invention.
Figure 21:
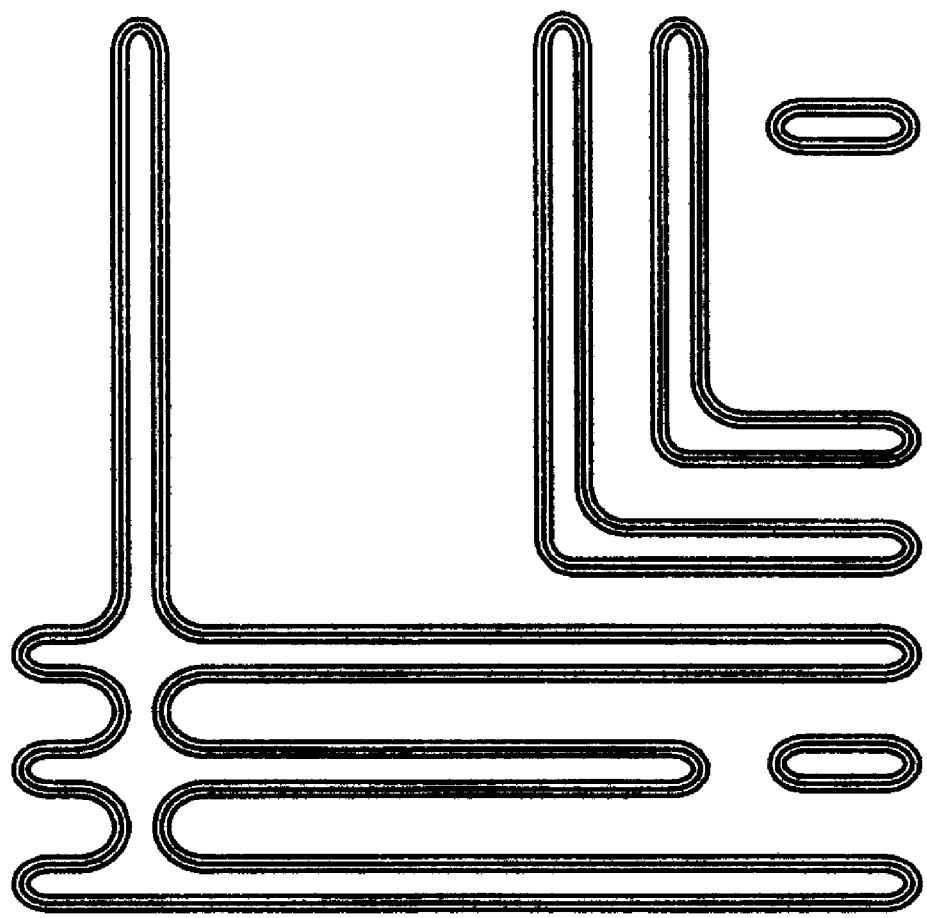
FIG. 21 shows characteristics of the wiring pattern formed in accordance with another embodiment of the present invention.

Explanation will be made as to an example of how to generate a pattern in accordance with the present embodiment, by referring to FIG. 20. First, as in the Embodiment 4, connection nodes ND and peripheral nodes SR were extracted from a pattern P to form a two-dimensional alternating phase-shifting mask 7A having openings corresponding to the extracted nodes. In this case, only line ends and corners were extracted as the connection nodes. Next all the line ends in the pattern P were shortened by an amount of W/2 corresponding to half of the minimum line width W to form a pattern P' and then to form a half-tone type phase-shifting mask 7B having openings corresponding to the pattern P'. The light intensity transmission factor of a half-tone type region 4 was set to be 6% and the phase of the transmission light was to be shifted by 180 degrees with respect to the phase of light passed through the openings. Next the two-dimensional alternating phase-shifting mask was exposed under an illumination condition having a coherence factor σ of 0.3, and the same resist film was exposed with the above half-tone type phase-shifting mask under an annular illumination condition (having the coherence factor σ of 0.4–0.8). For the exposure, a KrF exposure apparatus having an numerical aperture NA of 0.65 was used. A designed pattern is a wiring pattern, as in the Embodiment 4, having a line width of 0.15 μm and a line period of 0.3 μm. FIG. 21 shows a light intensity distribution obtained by multiple exposure. In accordance with the present embodiment, a desired pattern was able to be formed.

In this connection, the exposure of the two-dimensional alternating phase-shifting mask 7A of the present embodiment may be replaced by preparing a prior art type Cr mask having openings except for the phase shifter of the mask 7A and by exposing it by modified illumination such as annular illumination or quadruple illumination. Further, the light shielding part of the above Cr mask may be changed to a half-tone type region to form a half-tone type phase-shifting mask as in the mask 7B. In this conjunction, it is preferable to optimize the modified illumination condition in such a manner that the maximum optical contrast or focal depth can be obtained for a given interconnect pitch.

(Embodiment 8)

Figure 15:
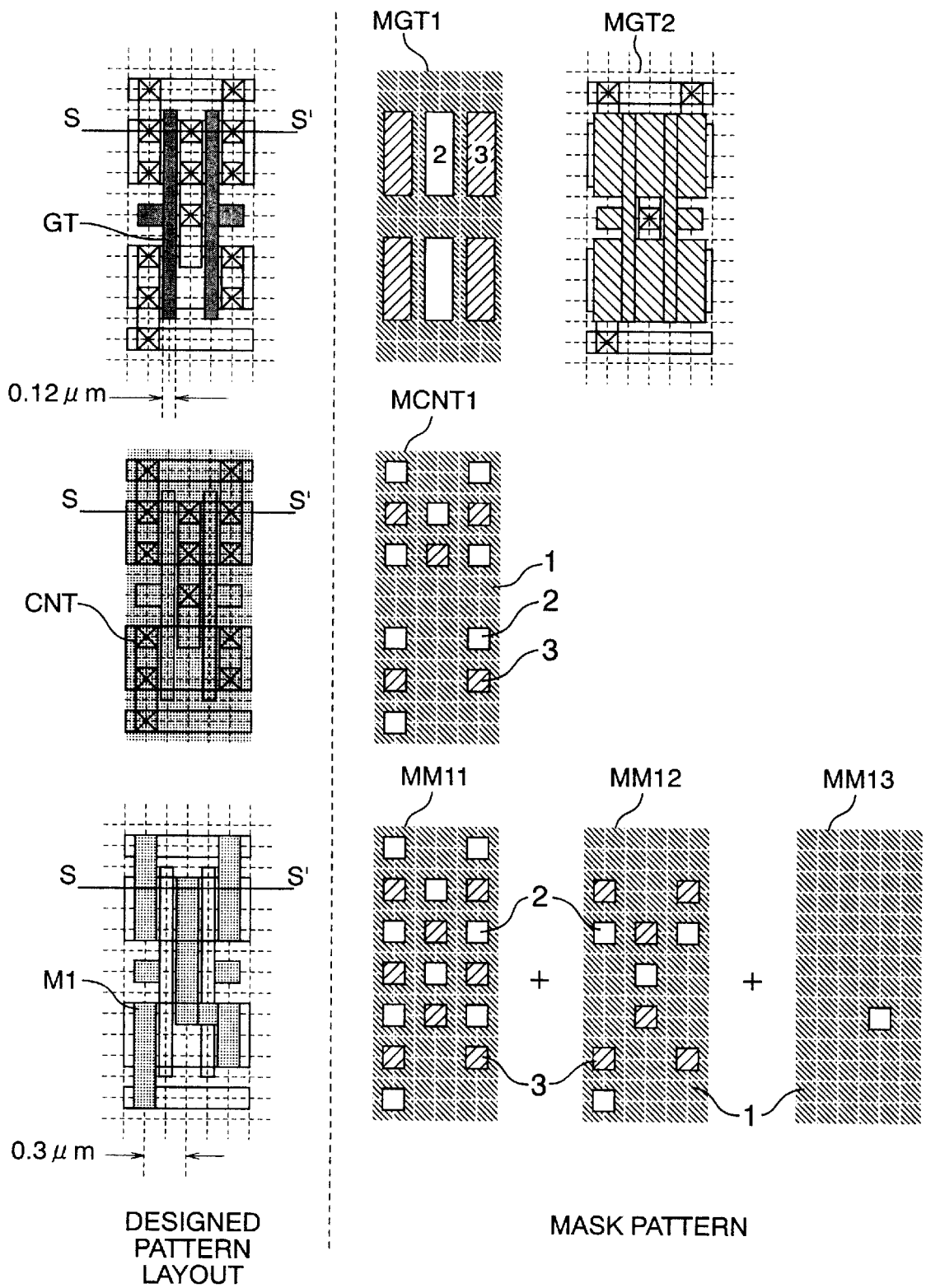
FIG. 15 shows various layer patterns in accordance with another embodiment of the present invention and mask patterns for formation thereof.

In the present embodiment, explanation will be made as to an example of a standard cell logic LSI designed assuming that the present invention is applied to wiring layer formation, and also as to its manufacturing process. FIG. 15 shows an exemplary circuit pattern and mask patterns to realizing it. For simplicity, only mask patterns for use in formation of a desired designed pattern and gates, contact holes and a first wiring layer only for NAND gate ones of the standard cells were illustrated. The respective patterns in FIG. 15 are illustrated as simplified for easy understanding of the drawing. A gate pattern GT is formed by multiple-exposing masks MGT1 and MGT2. A contact hole pattern CNT is formed by a mask MCNT1. A first wiring layer pattern Ml is formed by multiple-exposing three masks MM11, MM12 and MM13.

In FIG. 15, it is preferable to make the horizontal pitch of the gate pattern GT, contact pattern CNT and first wiring pattern M1 as small as possible. In the past, it has been often that, in order to secure alignment between contact and gate, the horizontal pitch of the gate and first wiring patterns is set in a range from three times to four times the gate length. In these years, however, the pitch has been able to be further reduced by using self-aligned contact (SAC). As seen from FIG. 15, in any of the masks, their horizontal direction part is an alternating phase shifter which can realize the maximum resolution attainable by the light reduction projection exposure method. Accordingly even in any of the layers, resolutions substantially similar to the above resolution can be attained. In the present embodiment, the gate length was set to be 0.12 μm and the horizontal pitch was to be 0.3 μm.

Figure 16:
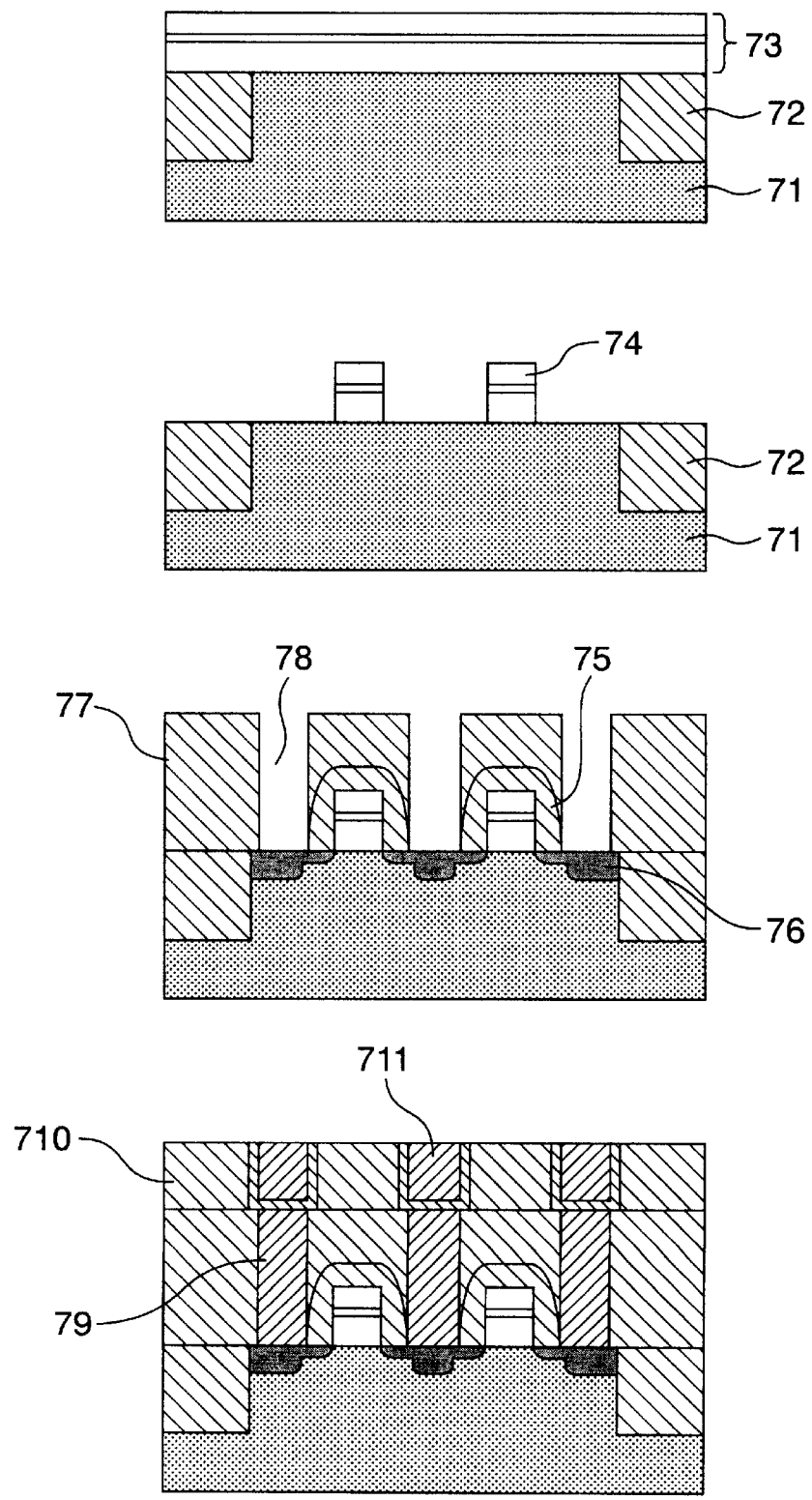
FIG. 16 shows steps of manufacturing a semiconductor device in accordance with another embodiment of the present invention.

Explanation will next be briefly made as to a process of manufacturing a semiconductor integrated circuit with use of the above masks by referring to a drawing. FIG. 16 diagrammatically shows a section of a device taken along a line S–T in FIG. 15. In this connection, a general flow of major steps in the process will be explained below, but it will be appreciated that the explanation will not cover all the detailed steps.

An SiN film was first formed on an Si substrate 71, a resist pattern was formed on parts to be later formed as active regions, the substrate was etched with use of the above resist pattern as a mask to form grooves therein, an Si oxide film was buried in the grooves, and then the surface of the substrate was flattened to form an element isolation 72. Subsequently ions were selectively implanted into predetermined regions to form wells, an gate insulating film was formed on the substrate, and then an gate material film 73 was deposited (refer to an uppermost step in FIG. 16). An anti-reflection film and a positive resist film were coated on the gate material film, the above two masks MGT1 and MG2 were aligned to marks (not shown) formed on the substrate and multiple-exposed on the resist film with use of the KrF excimer laser exposure apparatus. After the predetermined exposure, the substrate was subjected to heat treatment and development to form a resist pattern, the gate material film was etched with use of the above resist pattern as a mask to form gates 74 (refer to a second step in FIG. 16). Then predetermined heat treatment, impurity introduction, formation of sidewall spacers 75, formation of a source/drain diffusion region 76, etc. were carried out, an interlayer insulating film 77 was formed on the entire surface of the substrate, the surface of the substrate was flattened, an anti-reflection film and a positive resist film were again coated thereon, and the mask MCNT1 was exposed on the resist film with use of the KrF excimer laser exposure apparatus. After the predetermined exposure, heat treatment and development were carried out to form a resist pattern, and then the interlayer insulating film was etched with use of the above pattern as a mask to make contact holes 78 (refer to a third step in FIG. 16). Next, tungsten 79 was buried into the contact holes, the surface thereof was flattened, and then an oxide film 710 was formed thereon. Again an anti-reflection film and a positive resist film were coated, and three masks MM11, MM12 and MM13 were aligned to marks formed on the substrate and multiple-exposed on the resist film with use of the KrF excimer laser exposure apparatus. After the predetermined exposure, heat treatment and development were carried out to form a resist pattern, the oxide film was etched with use of the pattern as a mask, and then the oxide film of an area to be wired was removed to form grooves for wiring formation. Further, barrier metal and copper were deposited as buried in the grooves, and then the surface of the substrate was polished and flattened to form a first wiring pattern 711 (refer to a lowermost step in FIG. 16). Subsequently, steps of formation of interlayer insulating film, flattening, formation of connection holes, metal burial in the connection holes, flattening, formation of interlayer insulating film, formation of wiring grooves, burial of wiring material metal, and flattening were repeated to form a second wiring layer. Through repetition of the above process, a multi-layered wiring system was formed.

Figure 17:
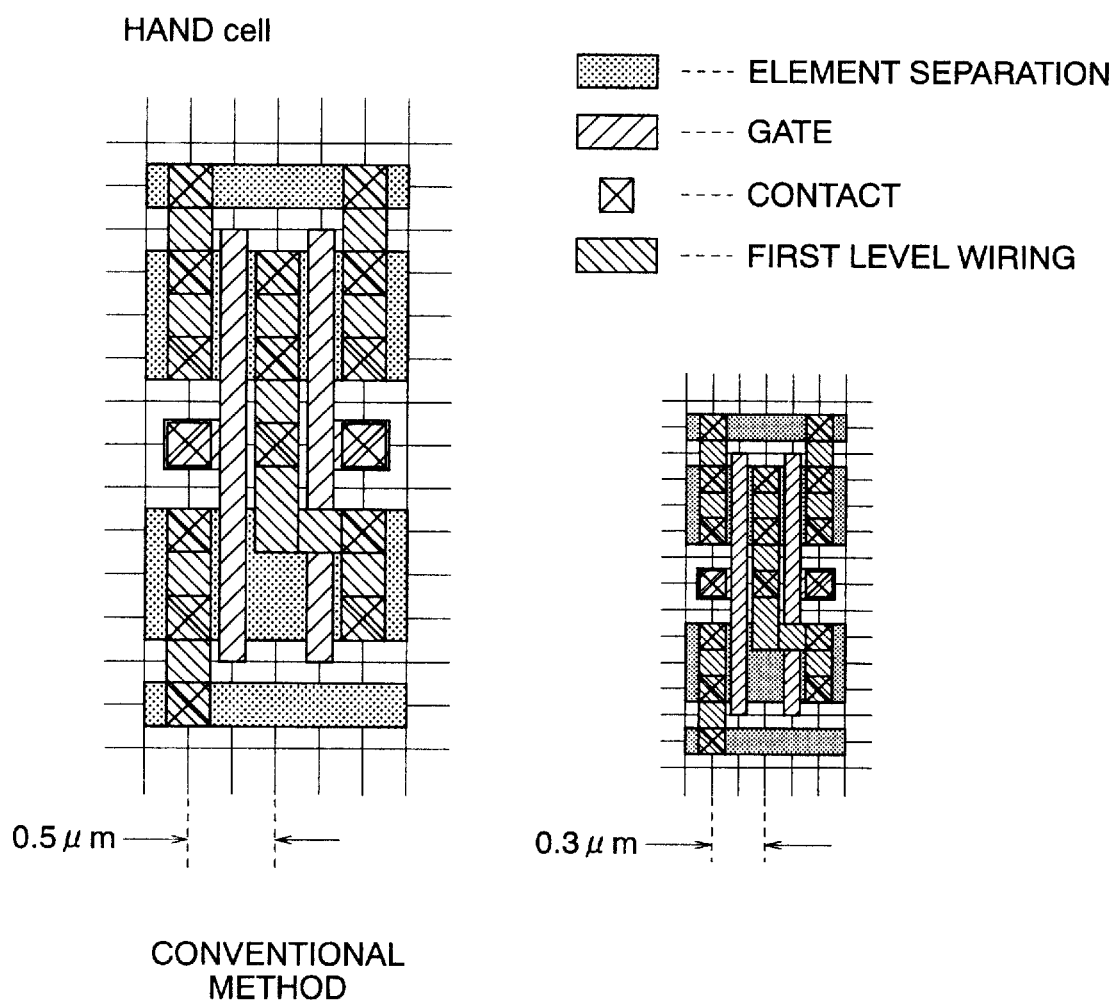
FIG. 17 shows diagrams for explaining the effect of another embodiment of the present invention.

FIG. 17 shows an area reduction effect of the aforementioned NAND cell in accordance with the present embodiment when the same exposure apparatus is used. When the KrF excimer laser exposure apparatus having an numerical aperture NA of 0.6 was used, the manufacturing method based on the prior art masks in which the present invention is not used has a interconnect pitch of 0.5 $\mu$m as its limit; whereas the method of the present invention has a interconnect pitch of 0.3 $\mu$m as its limit, exhibiting a clear area reduction effect.

In this connection, the gate length may be further shortened as necessary by shortening a gate pattern in its horizontal direction by utilizing side shift, etc. at the time of etching the gate pattern. Further, this design may be suitably enlarged or reduced by modifying the used exposure apparatus or resist process. For example, when the numerical aperture is changed to 0.68, major design dimensions can be reduced by an amount of about 10%; while, when an ArF excimer laser exposure apparatus is used, the numerical aperture can be reduced by an amount of about 20%.

(Embodiment 9)

In the present embodiment, explanation will be made in connection with an example wherein the present invention is applied to a gate array logic LSI. In this case, a cell-projection type electron beam was used for a step of forming so-called diffusion layers, that is, the element isolation pattern and gate pattern in the Embodiment 8. A design gate length was set to be 0.07 $\mu$m by utilizing the fineness of the electron beam writing direct method. Since the diffusion layer pattern of the gate array is a pattern of a cyclic repetition of a simple basic cell pattern, a relatively practical throughput was obtained even by the cell-projection method. The step of forming a wiring layer was carried out as in the Embodiment 8. Accordingly the interconnect pitch was 0.3 $\mu$m that was the same as that in the Embodiment 7.

(Embodiment 10)

Figure 18:
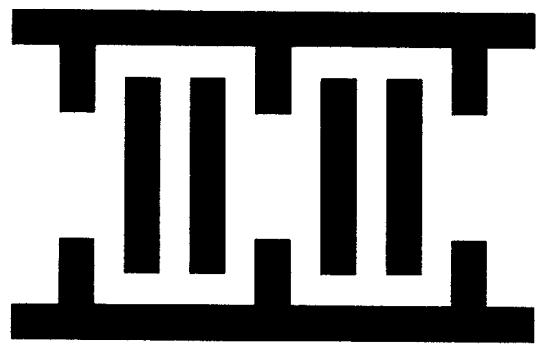
FIG. 18 shows a wiring pattern in accordance with another embodiment of the present invention and mask patterns for formation thereof.
Figure 18:
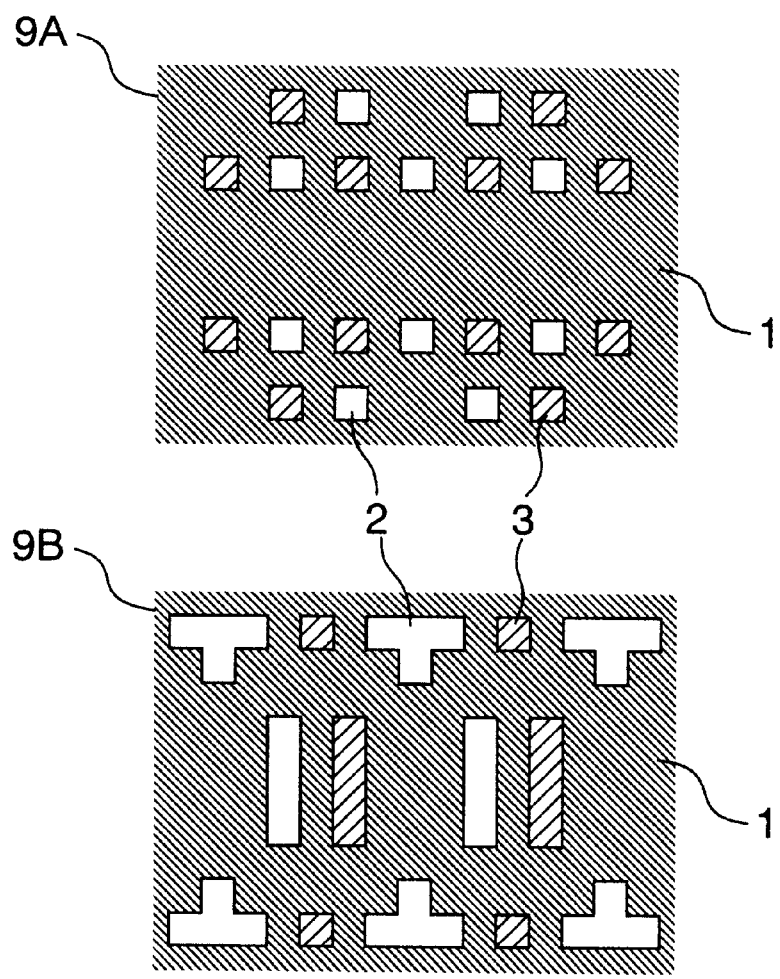

Explanation will be made as to an example wherein the present invention is applied to a first wiring layer of SRAM. For a designed pattern shown in a top part of FIG. 18, such masks 9A and 9B as shown in middle and bottom parts in FIG. 18 were generated. In this case, first, line ends and nodes in the vicinity thereof were extracted from the designed pattern according to the Embodiment 3 to generate a first phase-shifting mask 9A. However, as a result of having examined a remainder corresponding to a subtraction of the first mask from the original designed pattern, it has been found that the remainder can be formed with use of a single phase-shifting mask 9B. Accordingly although the present invention is a two-dimensional pattern, the original pattern can be formed by multiple exposure using two masks.

In this way, for a pattern such as a memory cell pattern made up of a less number of types of patterns, the number of necessary masks can be reduced and pattern optimization can be realized by manually decomposing the pattern to some extent.

(Embodiment 11)

Figure 19:
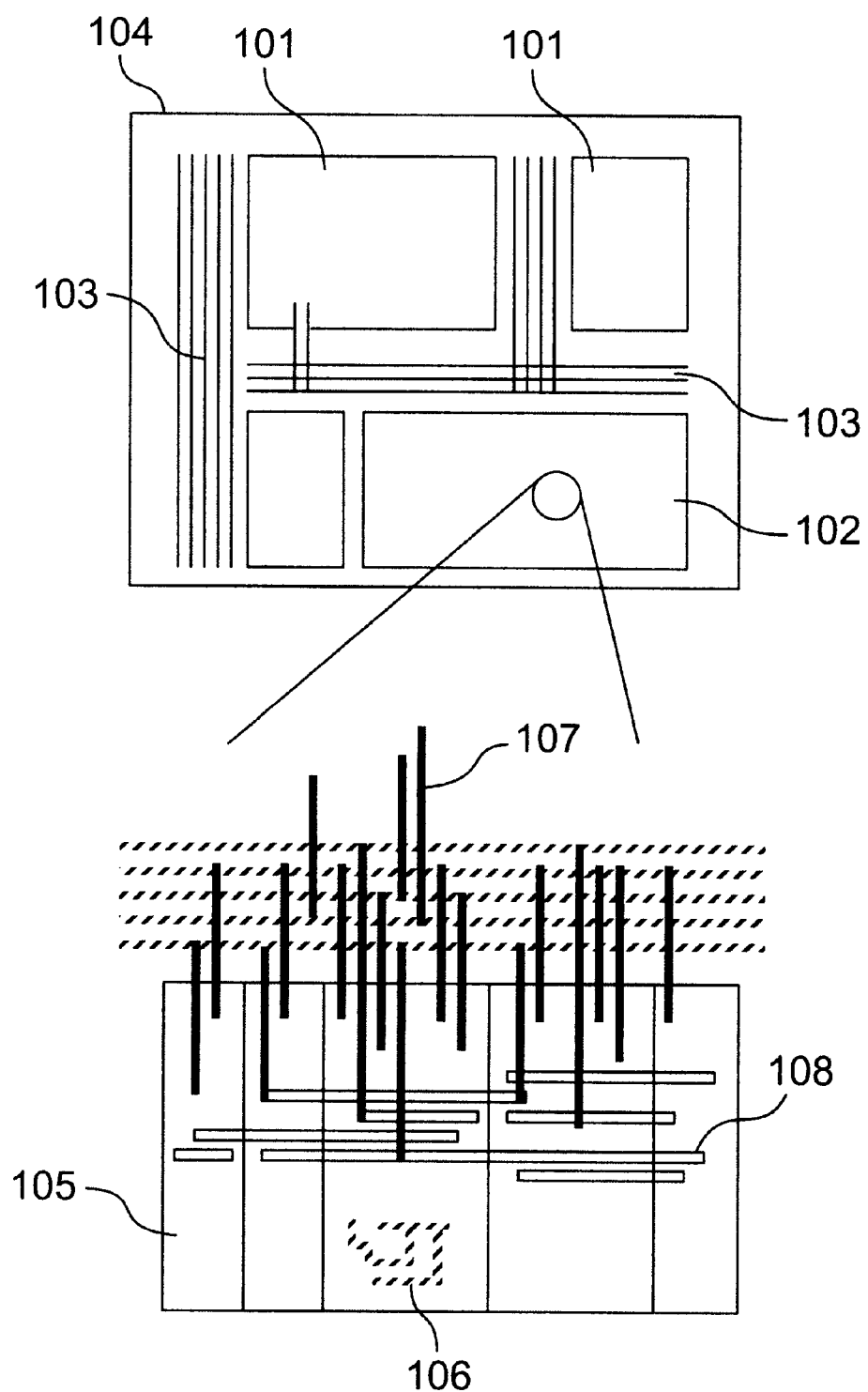
FIG. 19 shows an entire arrangement of a typical semiconductor device in accordance with another embodiment of the present invention.

In the present embodiment, explanation will be made in connection with an example wherein the present invention is applied a system LSI 104 including an interface, a logic circuit 101, a memory 102 and a data bus 103 for data transfer between the above circuit blocks, as diagrammatically shown in FIG. 19. In the case of this type LSI, since the properties of the circuit patterns vary from block to block, it is not desirable to decompose the pattern by an identical method over the entire surface of a chip. For example, a complex, fine two-dimensional pattern is limited substantially to the first wiring layer of a logic gate part, and the other patterns are mostly of a one-dimensional type. Accordingly it is required to carry out such complex pattern decomposition as explained in the Embodiments 1 to 4 only over the necessary logic gate pattern part, and it is sufficient to carry out such decomposition into two masks as explained in the Embodiment 5 over the other region.

More in detail, with respect to the logic gate part, after the layout and automatic wiring of logic cells 105, for example, a first wiring layer 106 corresponding to the logic gate part is decomposed into three masks by the method explained, e.g., in the Embodiment 1. With respect to standard cells or the like, when a cell interior pattern is previously decomposed into three masks, it is only required to array these masks. With respect to a cell boundary or invasion wiring, it is preferable to perform another operation over it as necessary. In this case, operations necessary for the mask pattern generation are all carried out through geometrical operation. Thus not only by automatically carrying out it but also by using a geometrical operation tool capable of performing hierarchy operation, the mask pattern generation can be realized at a high speed. With regard to a second wiring layer 107, a third wiring layer 108, and so on; most of the layers are of a one-dimensional pattern type which can be generated by an automatic layout/wiring method. Thus it is suitable to decompose the pattern into two masks according to the method described in the Embodiment 5.

With respect to the memory region, the number of types thereof is small and the cell boundary conditions are also clear as mentioned in the Embodiment 10. Therefore, it is not difficult to previously design manually a phase-shifting mask pattern. With regard to the data bus part, it may use the conventional one-dimensional phase-shifting method as necessary.

(Embodiment 12)

In the present invention, since a plurality of masks are multiple-exposed on an identical resist film, it becomes necessary to suppress an alignment error between patterns transferred by the respective masks to a minimum level. In the embodiments so far explained above, the first mask was aligned to the mark on the wafer and then exposed, after which the second mask was again aligned to the mark and then exposed. In this case, so-called 3-layer alignment is carried out between the first and second masks. However, there is no wafer process between the respective exposures, exactly the same alignment mark is detected by the same exposure apparatus. For this reason, an alignment error factor is, in principle, determined by the reproducibility error of the apparatus and by pattern position accuracies on the respective masks. Thus the alignment accuracy was higher than a usual interlayer alignment accuracy. In this connection, for the purpose of preventing shrinkage or the like of the resist film by light exposure, it is preferable to previously light-shield a region on the mask corresponding to the mark to avoid light exposure of the alignment mark on the wafer at the time of each mask exposure.

In the present embodiment, explanation will be made as to an example wherein the alignment accuracy is further improved by improving exposure sequence and masks.

In order to remove an error caused by the limit of detection reproducibility of the alignment mark on the wafer, first, a plurality of masks were multiple-exposed while the wafer was fixed. The substrate wafer is first fixed on a wafer suction base on a wafer stage, an alignment mark on the substrate is detected, and its detected signal (wafer mark signal) is stored. Next the first mask and the substrate are aligned to each other with use of the wafer mark signal and the detection signal of the alignment mark on the first mask, and thereafter the first mask is exposed. While the substrate wafer is not removed from the wafer suction base, the second mask and the substrate are aligned to each other with use of the wafer mark signal and the detection signal of the alignment mark on the second mask, and then the second mask is exposed. The operations are repeated for the third mask, as necessary. As a result, an alignment error factor between the patterns exposed with the respective masks merely includes an error caused by the limit of the detection reproducibility of the alignment marks on the masks and a position accuracy error of the patterns on the masks.

Next, in order to remove the error caused by the limit of the detection reproducibility of the alignment marks on the masks, the pattern (first pattern) on the first mask and the pattern (second pattern) on the second mask were arranged on a single mask side by side. The second pattern region on the mask was first light-shielded with use of the masking (blade) function of the exposure apparatus, and only the first pattern is exposed on the wafer substrate at a predetermined position (usually, a plurality of positions). Subsequently while the substrate wafer is not removed from the wafer suction base, the first pattern region is light-shielded with a masking blade, and only the second pattern is exposed on the wafer substrate. At this time, the wafer stage was moved, with respect to the respective predetermined positions, from the exposure position of the first pattern by an offset corresponding to a distance between origins of the first and second patterns on the masks on the wafer substrate, and then was exposed. In this case, it is assumed that the origins of the both regions in the multiple exposure coincide with each other. The above operations are repeated for the third pattern region on the same mask, as necessary. In place of moving the wafer stage by the above offset, the mask stage may be moved by an offset corresponding to a distance between the origins of the first and second patterns on the masks. In this case, the masking blade is not necessarily required and each pattern region may coincide with the effective exposure region of the exposure apparatus at most. However, fairly large mask and mask stage are required. In the case of a step and scan type exposure apparatus, it is required to scan different regions on the mask for the same region on the wafer.

When a chip size on the mask is smaller than half of the effective exposure region of the exposure apparatus, simpler operation is realized. First, for a predetermined position on the substrate, the first and second pattern regions are collectively exposed. Next the wafer stage is moved by an offset corresponding to a distance between the origins of the first and second pattern regions on the masks on the wafer substrate to collectively expose the first and second pattern regions again. As a result, the first exposure region in the second exposure was transferred to the second pattern region transferred by the first exposure as overlapped therewith. When the above procedure is repeated, the first and second pattern regions can be multiple-exposed on the entire surface of the wafer without using the masking blade function. When the third pattern is multiple-exposed, it is required that the first, second and third pattern regions are arranged on the mask so that the regions are all included in the effective exposure region of the exposure apparatus and that the above offset is set to correspond to the above distance between the region origins.

The aforementioned procedure can be applied not only to the step and repeat type reduction projection exposure apparatus but also to a step and scan type reduction projection exposure apparatus.

What is claimed is:

1. A method for manufacturing a semiconductor device comprising a step of transferring first and second line-shaped patterns, which are arranged side by side in a longitudinal direction, onto a resist film on a substrate with use of a plurality of masks including a first mask, wherein:

said pattern transferring step includes a step of exposing said first mask which has first to fourth openings, said first and second openings being provided so as to correspond to first and second ends of said first line-shaped pattern, said third and fourth openings being provided so as to correspond to third and fourth ends of said second line-shaped pattern, and said second and third ends being adjacent to each other; and phases of light passed through said second and third openings corresponding to said adjacent second and third ends are mutually inverted.

2. A method for manufacturing a semiconductor device as set forth in claim 1, wherein said pattern transferring step further includes a step of exposing a second mask which has a fifth opening provided in a first area between said first and second openings of said first line-shaped pattern, and said sixth opening provided in a second area between said third and fourth openings of said second line-shaped pattern.

3. A method for manufacturing a semiconductor device comprising a step of transferring a first line-shaped pattern and second and third line-shaped patterns, which are arranged parallel and adjacent to said first line-shaped pattern and in a row in a longitudinal direction, onto a resist film on a substrate with use of a plurality of masks including first and second masks, wherein:

said pattern transferring step includes the steps of:

exposing said first mask having first to sixth openings, said first and second openings being provided so as to correspond to first and second ends of said first line-shaped pattern, said third and fourth openings being provided so as to correspond to third and fourth ends of said second line-shaped pattern, and said fifth and sixth openings being provided so as to correspond to fifth and sixth ends of said third line-shaped pattern; and exposing said second mask having seventh to ninth openings, said seventh opening being provided in a first area between said first and second ends of said first line-shaped pattern, said eighth opening being provided in a second area between said third and fourth ends of said second line-shaped pattern, and said ninth opening being provided in a third area between said fifth and sixth ends of said third line-shaped pattern.

4. A method for manufacturing a semiconductor device as set forth in claim 3, wherein said pattern transferring step further includes a step of exposing said second mask for inverting a phase of light passed through said seventh opening with respect to a phase of light passed through said eighth and ninth openings.

5. A method for manufacturing a semiconductor device comprising a step of transferring a broken-line-shaped pattern, which has a corner, onto a resist film on a semiconductor substrate with use of a plurality of masks including a first mask, wherein:

said pattern transferring step uses said first mask having first to third openings, said first and second openings being provided so as to correspond to first and second ends of said broken-line-shaped pattern, and said third opening being provided so as to correspond to said corner of said broken-line-shaped pattern.

6. A method for manufacturing a semiconductor device as set forth in claim 5, wherein:

said pattern transferring step further includes a step of exposing a second mask having fourth and fifth openings, said fourth opening being provided in a first area between said first end and said corner of said broken-line-shaped pattern, and said fifth opening being provided in a second area between said second end and said corner of said broken-line-shaped pattern.

7. A method for manufacturing a semiconductor device comprising a step of transferring a line-shaped pattern, which has a branch, onto a resist film on a semiconductor substrate with use of a plurality of masks including a first mask, wherein:

said pattern transferring step uses said first mask which has first to third openings, said first and second openings being provided so as to correspond to first and second ends of said line-shaped pattern, and said third opening being provided so as to correspond to said branch of said line-shaped pattern.

8. A method for manufacturing a semiconductor device comprising a step of transferring a line-shaped pattern, which has an intersection, onto a resist film on a semiconductor substrate with use of a plurality of masks including a first mask, wherein:

said pattern transferring step uses said first mask having first to third openings, said first and second openings being provided so as to correspond to first and second ends of said line-shaped pattern, and said third opening being provided so as to correspond to said intersection of said line-shaped pattern.

* * * * *